(12) United States Patent
Lee et al.

(10) Patent No.: US 10,998,375 B2
(45) Date of Patent: May 4, 2021

(54) LIGHT EMITTING MODULE AND AUTOMOTIVE ILLUMINATION DEVICE INCLUDING THE SAME

(71) Applicant: Samsung Electronics Co., Ltd., Suwon-si (KR)

(72) Inventors: Junho Lee, Seoul (KR); Namhyeok Kwak, Seoul (KR); Gunduk Kim, Yongin-si (KR); Seungwoo Lee, Hwaseong-si (KR); Do-Hun Kim, Seoul (KR); Heedong Kim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/512,850

(22) Filed: Jul. 16, 2019

(65) Prior Publication Data

US 2020/0152694 A1  May 14, 2020

(30) Foreign Application Priority Data

Nov. 13, 2018 (KR) .................. 10-2018-0139021

(51) Int. Cl.

| | | |
|---|---|---|
| *H01L 33/50* | (2010.01) | |
| *H01L 27/15* | (2006.01) | |
| *F21S 41/13* | (2018.01) | |
| *F21S 41/153* | (2018.01) | |
| *H01L 25/075* | (2006.01) | |

(Continued)

(52) U.S. Cl.
CPC ............ *H01L 27/156* (2013.01); *F21S 41/13* (2018.01); *F21S 41/153* (2018.01); *H01L 25/0753* (2013.01); *H01L 33/08* (2013.01); *H01L 33/50* (2013.01); *H01L 33/502* (2013.01); *H01L 33/58* (2013.01); *H01L 2933/0041* (2013.01)

(58) Field of Classification Search
CPC ...... H01L 27/156; H01L 33/08; H01L 33/502; H01L 33/58; H01L 25/0753
USPC .......................................... 257/88, 98
See application file for complete search history.

(56) References Cited

U.S. PATENT DOCUMENTS 6,547,400 B1 * 4/2003 Yokoyama ........... G03B 21/208
353/98
7,445,340 B2 * 11/2008 Conner ................. G02B 27/283
348/E5.143

(Continued)

FOREIGN PATENT DOCUMENTS

| EP | 2161494 A1 | 3/2010 |
|---|---|---|
| EP | 2270389 A1 | 1/2011 |

(Continued)

*Primary Examiner* — David Vu
*Assistant Examiner* — Brandon C Fox
(74) *Attorney, Agent, or Firm* — Harness, Dickey & Pierce, P.L.C.

(57) ABSTRACT

Disclosed are light emitting modules and automobile illumination devices including the same. The light emitting module comprises a module substrate, a light emitting device on the module substrate, and a light guide structure apart from the module substrate and in plan view surrounding the light emitting device. The light emitting device comprises a first pixel and a second pixel each including a light emitting diode (LED) chip that emits light whose wavelength falls within a range of blue color or ultraviolet ray, and a wavelength conversion material on a top surface of at least one of the first and second pixels.

17 Claims, 34 Drawing Sheets

(51) Int. Cl.
*H01L 33/58* (2010.01)
*H01L 33/08* (2010.01)

(56) References Cited

U.S. PATENT DOCUMENTS

| | | | |
|---|---|---|---|
| 8,203,165 B2 * | 6/2012 | Lee | H01L 33/62 |
| | | | 257/99 |
| 8,764,257 B2 | 7/2014 | De Lamberterie | |
| 9,121,566 B2 | 9/2015 | de Lamberterie | |
| 9,257,416 B2 | 2/2016 | Akimoto et al. | |
| 9,905,543 B2 | 2/2018 | Yeon et al. | |
| 9,954,028 B2 | 4/2018 | Yeon et al. | |
| 2008/0094835 A1 * | 4/2008 | Marra | F21K 9/64 |
| | | | 362/247 |
| 2008/0191620 A1 * | 8/2008 | Moriyama | H01L 33/56 |
| | | | 313/506 |
| 2011/0300644 A1 * | 12/2011 | Akimoto | H01L 33/508 |
| | | | 438/7 |
| 2012/0087108 A1 * | 4/2012 | Ke | H01L 25/0753 |
| | | | 362/97.1 |
| 2013/0264946 A1 * | 10/2013 | Xu | H01L 33/50 |
| | | | 315/151 |
| 2014/0362600 A1 * | 12/2014 | Suckling | F21S 41/143 |
| | | | 362/583 |
| 2017/0236866 A1 | 8/2017 | Lee et al. | |
| 2017/0250316 A1 * | 8/2017 | Yeon | H01L 25/0753 |
| 2018/0047880 A1 * | 2/2018 | Lim | H01L 33/507 |
| 2018/0166424 A1 | 6/2018 | Sim et al. | |
| 2018/0190625 A1 * | 7/2018 | Steckel | H01L 25/0753 |

FOREIGN PATENT DOCUMENTS

| | | |
|---|---|---|
| EP | 2792940 A2 | 10/2014 |
| KR | 10-2018-0087686 A | 8/2018 |
| KR | 10-2020-0005942 A | 1/2020 |
| KR | 10-2020-00059242 A | 2/2020 |

* cited by examiner

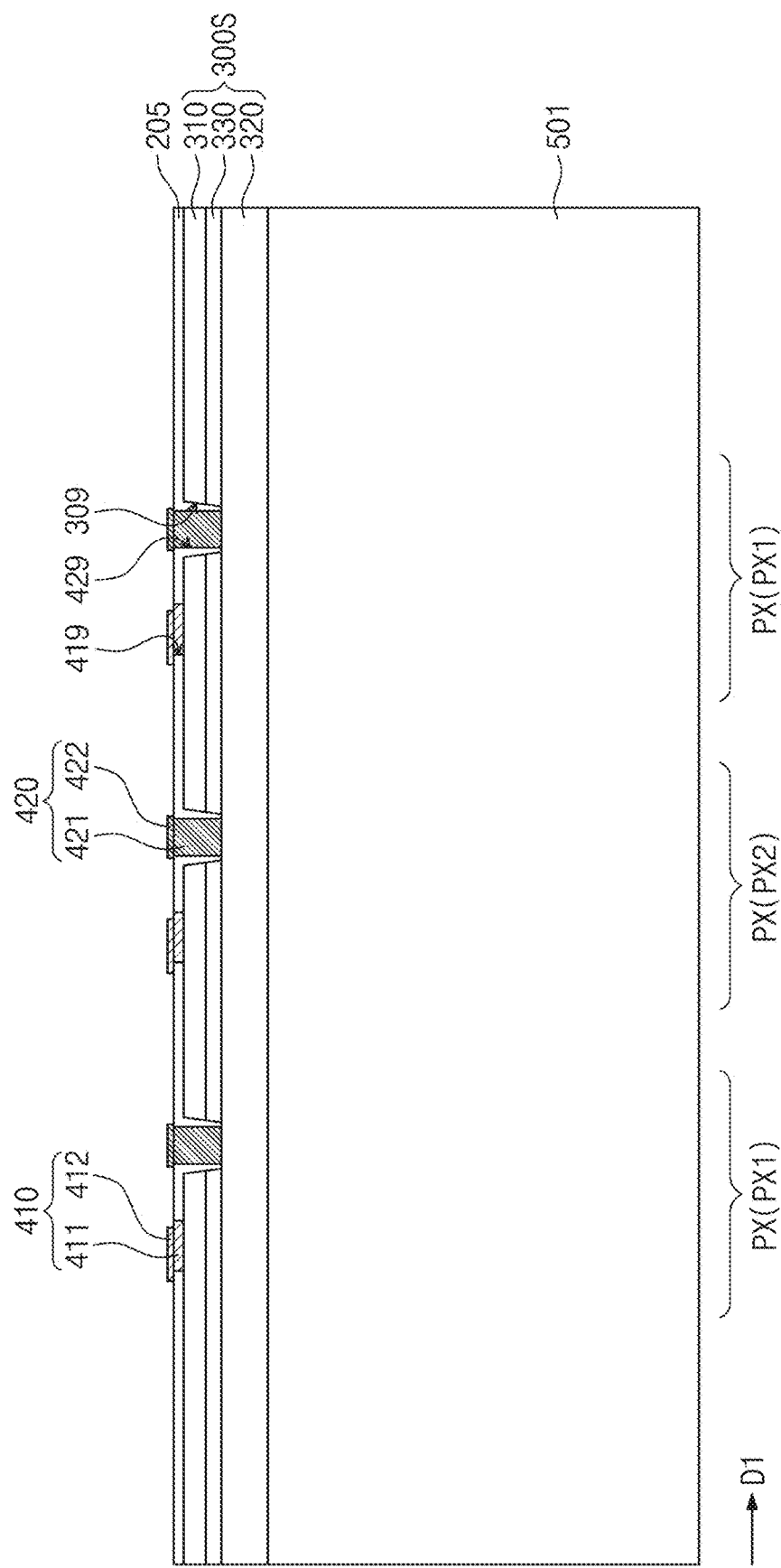

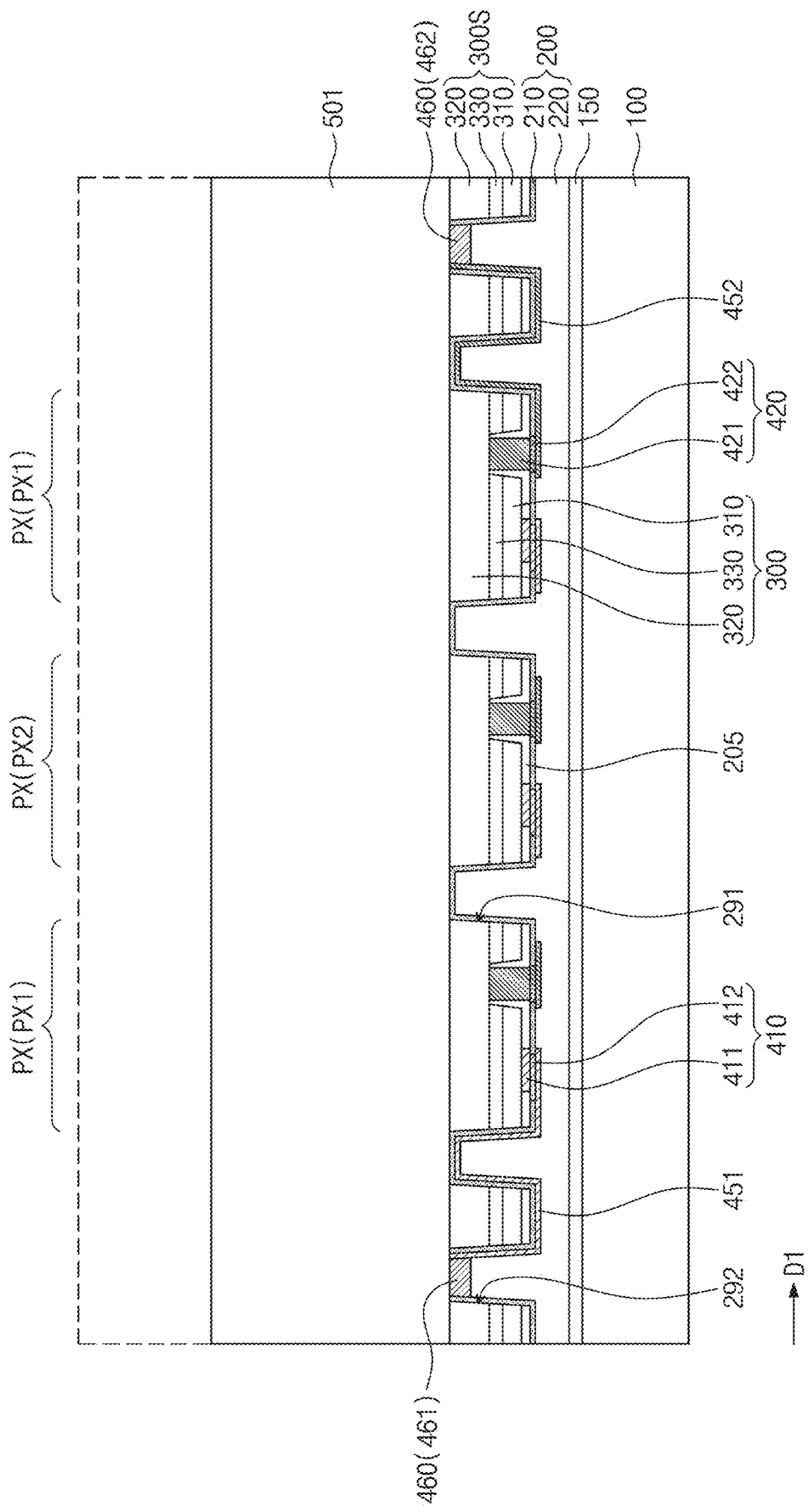

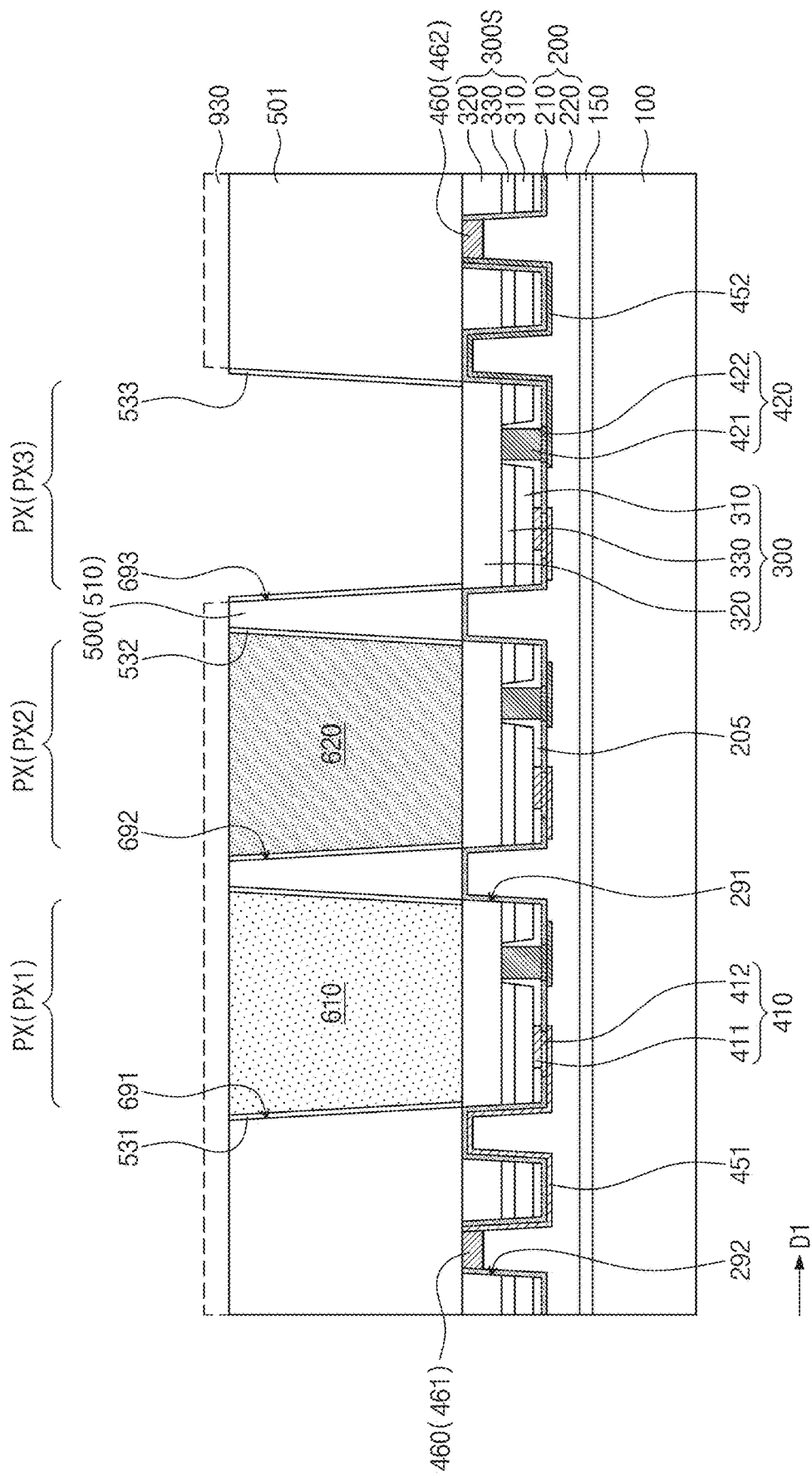

LIGHT EMITTING MODULE AND AUTOMOTIVE ILLUMINATION DEVICE INCLUDING THE SAME

CROSS-REFERENCE TO RELATED APPLICATION

This U.S. nonprovisional application claims priority under 35 U.S.C § 119 to Korean Patent Application No. 10-2018-0139021 filed on Nov. 13, 2018 in the Korean Intellectual Property Office, the entire contents of which are hereby incorporated by reference.

BACKGROUND

The present inventive concepts relate to a light emitting module, and more particularly, to a light emitting module including a light guide structure.

Light emitting devices, such as light emitting diodes, are apparatus in which light is released from materials included therein. Light emitting devices emit light converted from energy due to recombination of electrons and holes contained in combined semiconductors. Such light emitting devices are currently in widespread used as illumination, display devices, and light sources, and development thereof has been accelerated. As light emitting devices become wider in their application, technology is required to increase luminance efficiency and/or reliability of light emitting modules. In addition, reduction or miniaturization of electronic products leads to requirements for further compactness of light emitting modules used for the electronic products.

SUMMARY

Some example embodiments of the present inventive concepts provide a light emitting module with improved luminance efficiency.

Some example embodiments of the present inventive concepts provide a more compact-sized light emitting module.

According to some example embodiments of the present inventive concepts, a light emitting module may comprise: a module substrate; a light emitting device on the module substrate; and a light guide structure apart from the module substrate and surrounding the light emitting device in plan view. The light emitting device may comprise: a first pixel and a second pixel each including a light emitting diode (LED) chip configured to emit light whose wavelength falls within a range of blue color or ultraviolet ray; and a wavelength conversion material on a top surface of at least one of the first and second pixels.

According to some example embodiments of the present inventive concepts, a light emitting module may comprise: a module substrate; a light emitting device on the module substrate; and a light guide structure apart from the module substrate and guiding light emitted from the light emitting device. The light emitting device may comprise: a first pixel and a second pixel each including a light emitting diode (LED) chip configured to emit light whose wavelength falls within a range of blue color or ultraviolet ray; and a wavelength conversion material on a top surface of at least one of the first and second pixels.

According to some example embodiments of the present inventive concepts, an automobile illumination device may comprise: a module substrate; a light emitting device on the module substrate; and a light guide structure apart from the module substrate and guiding light emitted from the light emitting device. The light emitting device may comprise: a first pixel and a second pixel each including a light emitting diode (LED) chip configured to emit light whose wavelength falls within a range of blue color or ultraviolet ray; and a wavelength conversion material on a top surface of at least one of the first and second pixels.

BRIEF DESCRIPTION OF THE DRAWINGS

FIGS. 3A to 3I illustrate cross-sectional views showing a method of fabricating a light emitting device according to some example embodiments.

FIGS. 6A to 6C illustrate cross-sectional views showing a method of fabricating a light emitting device according to some example embodiments.

DETAILED DESCRIPTION OF EMBODIMENTS

Figure 1A:
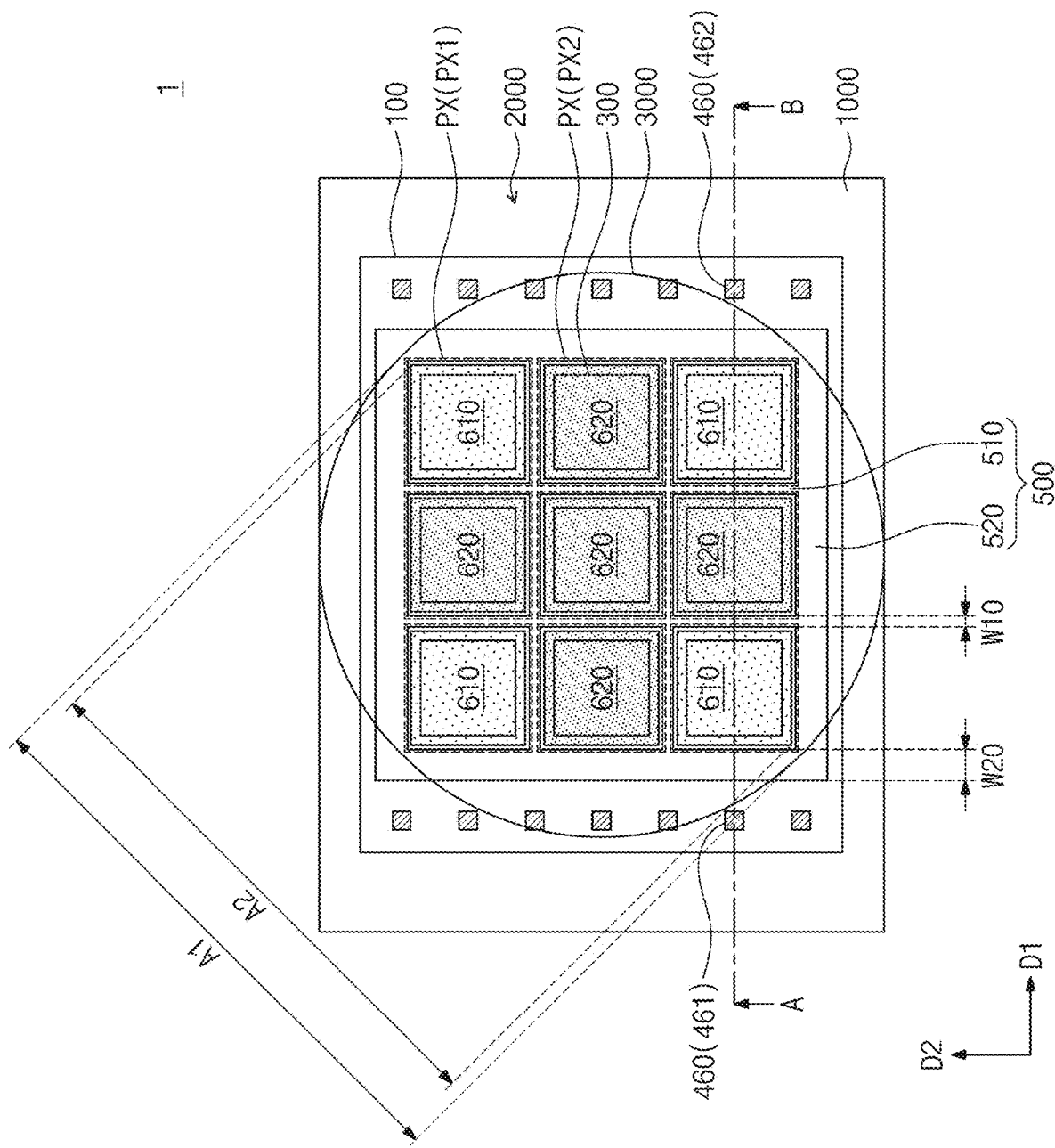
FIG. 1A illustrates a plan view showing a light emitting module according to some example embodiments.

In this description, like reference numerals may indicate like components. The following will now describe a light emitting device and a light emitting module including the same according to the present inventive concepts.

Figure 1B:
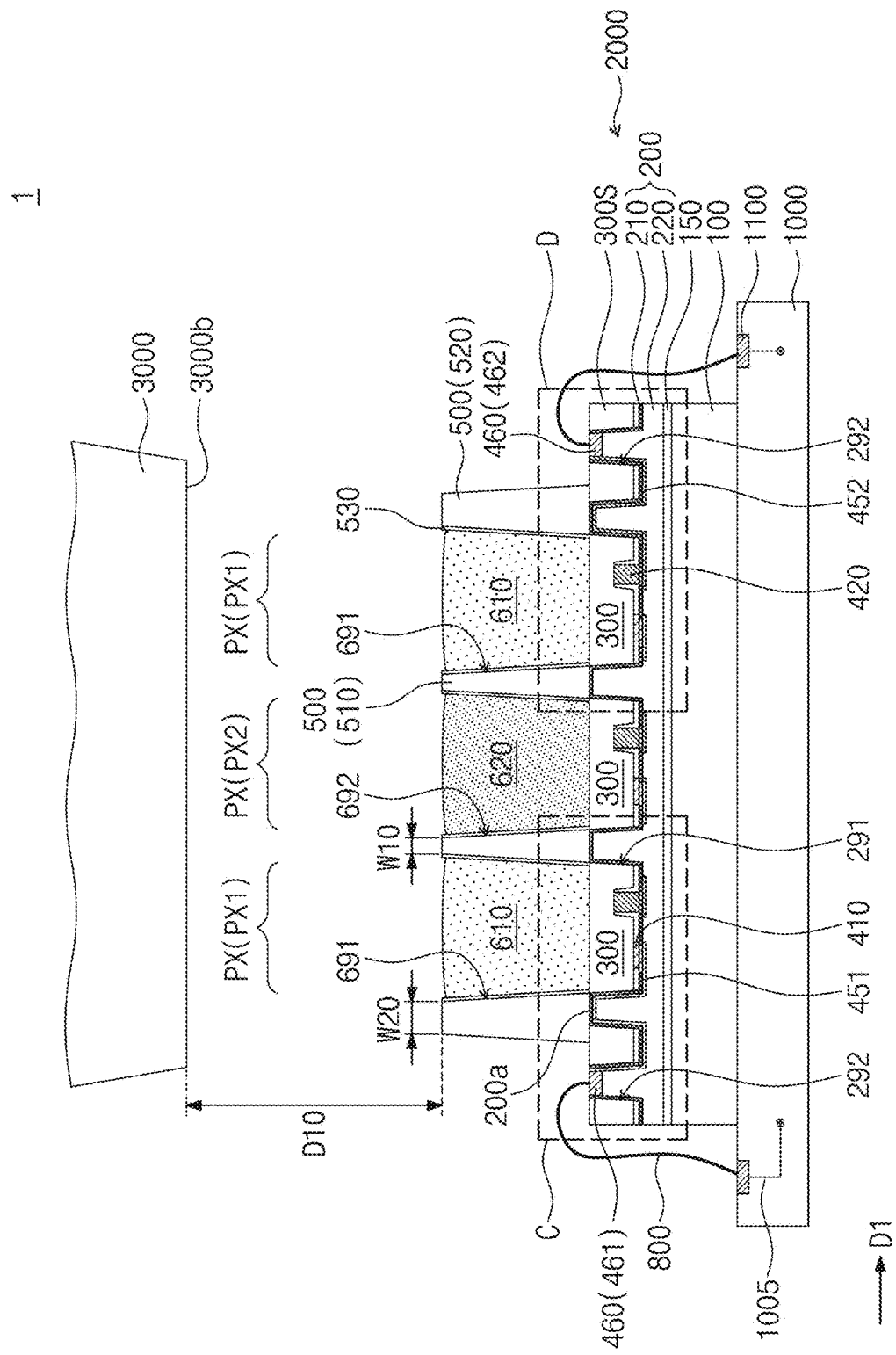
FIG. 1B illustrates a cross-sectional view taken along line A-B of FIG. 1A.
Figure 1C:
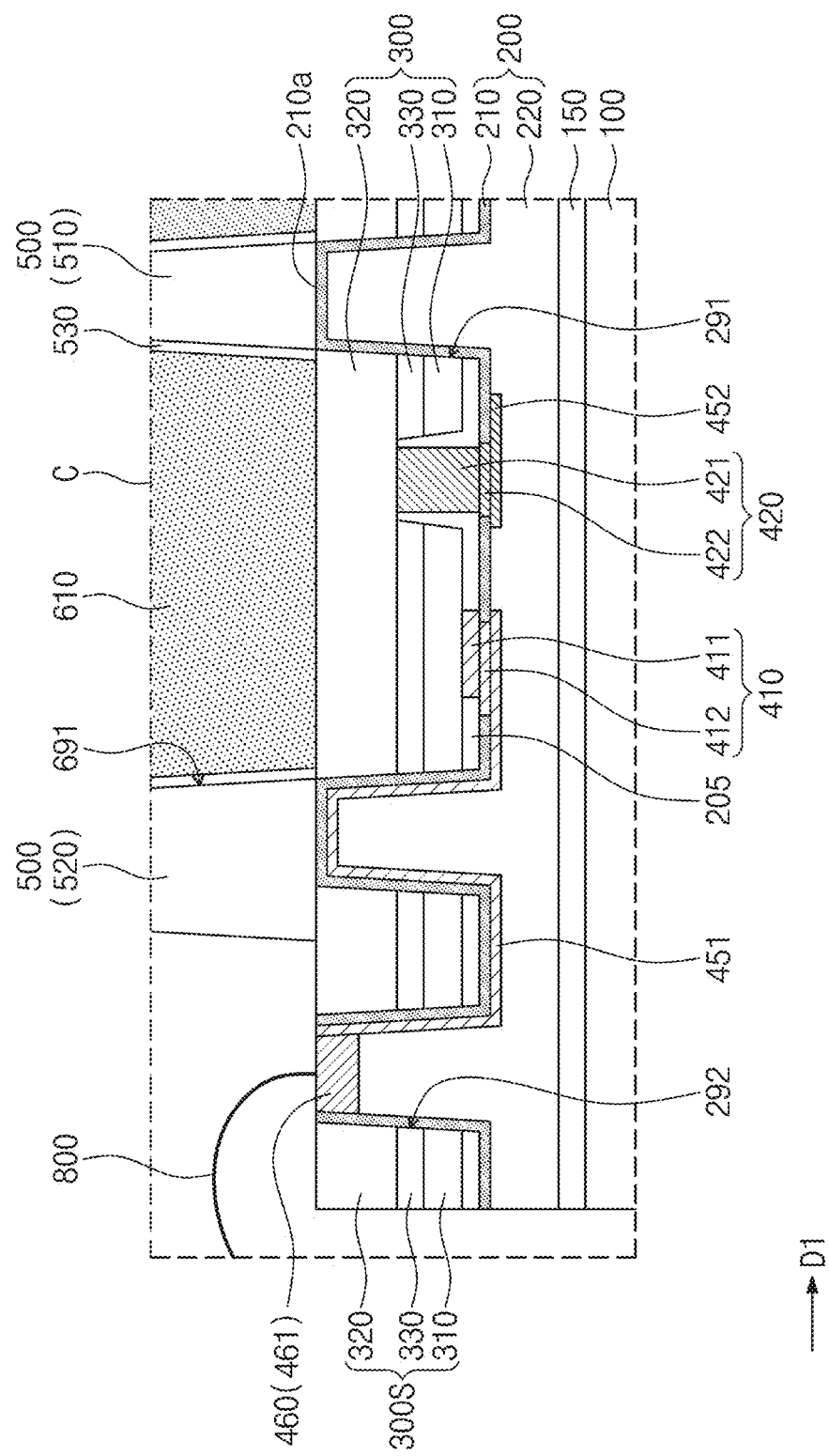
FIG. 1C illustrates an enlarged view of section C shown in FIG. 1B.
Figure 1D:
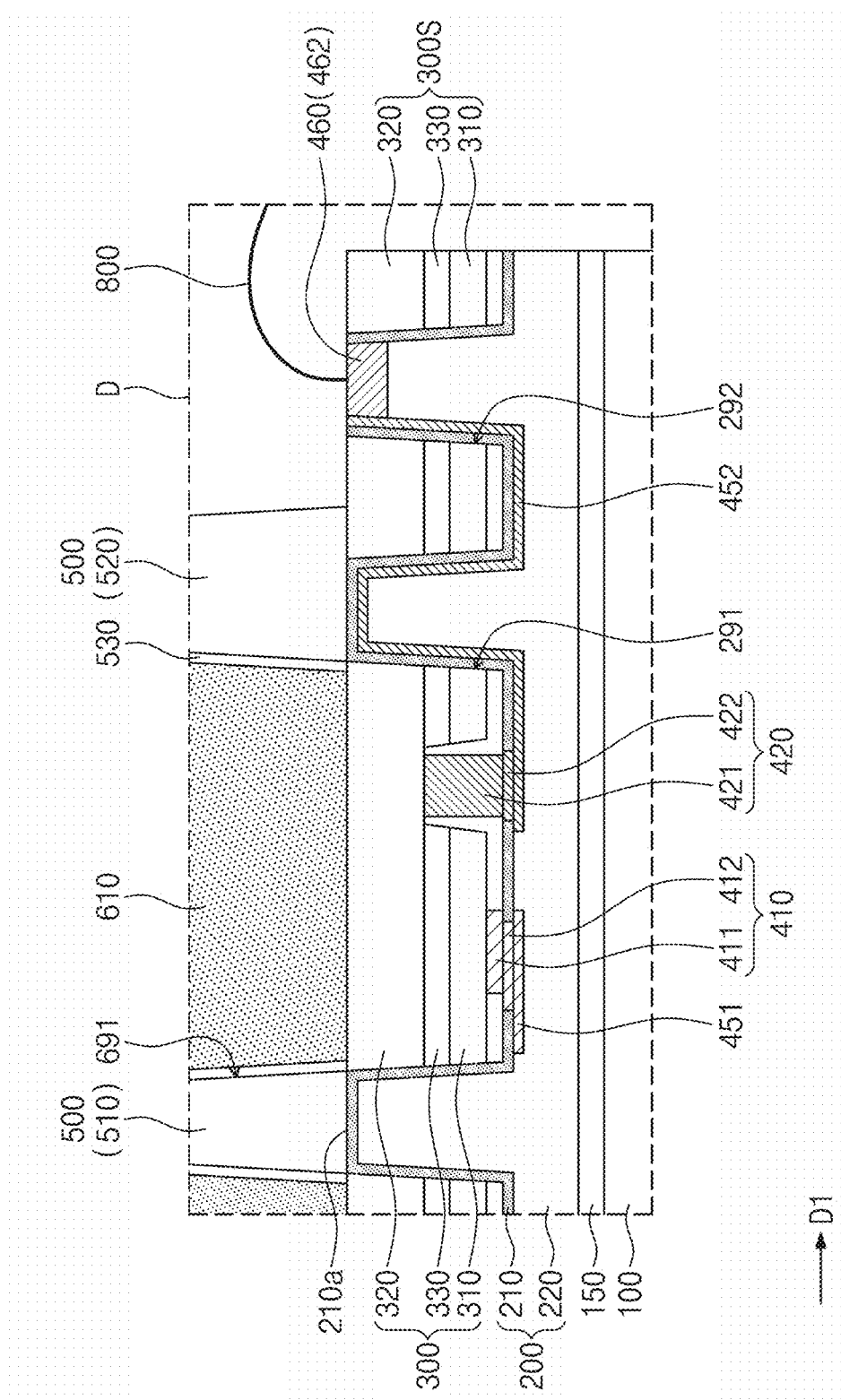
FIG. 1D illustrates an enlarged view of section D shown in FIG. 1B.

FIG. 1A illustrates a plan view showing a light emitting module according to some example embodiments. FIG. 1B illustrates a cross-sectional view taken along line A-B of FIG. 1A. FIG. 1C illustrates an enlarged view of section C shown in FIG. 1B. FIG. 1D illustrates an enlarged view of section D shown in FIG. 1B.

Referring to FIGS. 1A and 1B, a light emitting module 1 may include a module substrate 1000, a light emitting device 2000, and/or a light guide structure 3000. The module substrate 1000 may include, for example, a printed circuit board (PCB). The module substrate 1000 may include substrate pads 1100 on a top surface thereof. The substrate pads 1100 may include a conductive material such as metal, and may be coupled to connection lines 1005 in the module substrate 1000.

The light emitting device 2000 may be mounted on the module substrate 1000. The light emitting device 2000 may be used as the light emitter. Therefore, the light emitting module 1 may have smaller size and/or weight.

The light emitting device 2000 may include connection pads 460, and when viewed in plan, the connection pads 460 may be provided on an edge region of the light emitting device 2000. The connection pads 460 may include a conductive material such as metal. The connection pads 460 may serve as terminals of the light emitting device 2000. For example, the connection pads 460 may be provided thereon with bonding wires 800 coupled to the connection pads 460 and the substrate pads 1100. The bonding wires 800 may include a conductive material such as gold (Au). The light emitting device 2000 may be electrically connected to the module substrate 1000 through the connection pads 460 and the bonding wires 800. In this description, the phrase "electrically connected/coupled to the module substrate 1000" may mean "electrically connected/coupled to the connection lines 1005 of the module substrate 1000." In figures except FIG. 1B, the connection lines 1005 are not illustrated for brevity. In certain embodiments, neither the bonding wires 800 nor the connection pads 460 may be provided, and the substrate pads 1100 may be disposed on a bottom surface of the light emitting device 2000. Electrodes (not shown) may be provided in the module substrate 1000. The substrate pads 1100 may be correspondingly coupled through the electrodes to first and second electrode patterns 410 and 420 which will be discussed below.

The light emitting device 2000 may have a plurality of pixels PX. The pixels PX may form a pixel array when viewed in plan. For example, the light emitting device 2000 may have a pixel array including the pixels PX. When viewed in plan, the pixels PX may be two-dimensionally arranged along a first direction D1 and a second direction D2. The first and second directions D1 and D2 may be parallel to the top surface of the module substrate 1000. The second direction D2 may intersect the first direction D1. The pixel array may be provided on a central region of the light emitting device 2000. When viewed in plan, the pixel array may be spaced apart from the connection pads 460. The pixels PX may have substantially the same size. For example, each of the pixels PX may have width and length dimensions of about 1 μm to about 3000 μm. The pixels PX may be spaced apart from each other at a substantially regular interval. For example, the pixels PX may be arranged at a pitch of about 1 μm to about 1500 μm. In other embodiments, the pixels PX may have different sizes from each other.

At least two of the pixels PX may emit light of different wavelengths. The pixels PX may include a first pixel PX1 and a second pixel PX2. The first pixel PX1 may be configured to emit light of a first wavelength to produce a first color. The second pixel PX2 may be configured to emit light of a second wavelength different from the first wavelength. The second pixel PX2 may be configured to produce a second color different from the first color. The pixels PX of the light emitting device 2000 may be electrically separated from each other. The pixels PX of the light emitting device 2000 may operate independently of each other. The pixels PX may be defined by a partition 500, for example, a partition wall, or a partition wall structure, which will be discussed below.

As shown in FIG. 1B, the light emitting device 2000 may include a substrate 100, a pixel isolation pattern 200, light emitting diode (LED) chips 300, a partition 500, and/or fluorescent layers 610 and 620. The substrate 100 may include a dielectric material. For example, the substrate 100 may include but not limited to a sapphire substrate, a glass substrate, a transparent conductive substrate, a silicon substrate, or a silicon carbide substrate. The pixels PX may share the substrate 100. The substrate 100 may overlap a plurality of the pixels PX.

The LED chips 300 may be provided on the substrate 100. The LED chips 300 may be provided on corresponding pixels PX. When viewed in plan, an arrangement of the LED chips 300 may correspond to that of the pixels PX. For example, as shown in FIG. 1A, the LED chips 300 may be arrayed in the first and second directions D1 and D2. When the light emitting device 2000 operates, the LED chips 300 may generate light. The LED chips 300 may emit light of the same intensity. For example, the intensity of light emitted from each of the LED chips 300 may have a tolerance equal to or less than about 5% of an average intensity of light emitted from the LED chips 300. The LED chips 300 may emit light whose wavelength falls within a range of blue color or ultraviolet ray. The LED chips 300 may release light of the same wavelength. For example, each of the LED chips 300 may release light of a certain peak wavelength. Each of the LED chips 300 may have a tolerance equal to or less than about 5% of an average peak wavelength of light emitted from the LED chips 300. The certain peak wavelength may be in a range from about 430 nm to about 480 nm. The certain peak wavelength may correspond to blue color. Thus, the LED chips 300 may emit blue-colored light.

The pixel isolation pattern 200 may be provided between sidewalls of the LED chips 300. A gap may be provided between the substrate 100 and bottom surfaces of the LED chips 300. For example, the pixel isolation pattern 200 may be provided in a first opening 291, which is provided between the LED chips 300. The pixel isolation pattern 200 may include a dielectric material. The pixel isolation pattern 200 may physically and electrically separate the LED chips 300 from each other. Therefore, the LED chips 300 may operate independently of each other. The pixel isolation pattern 200 may be provided in the gap between the substrate 100 and the bottom surfaces of the LED chips 300. The pixel isolation pattern 200 may include a buried dielectric layer 220 and/or a liner layer 210.

An adhesive layer 150 may be provided between the substrate 100 and the pixel isolation pattern 200. For example, the adhesive layer 150 may be placed between the substrate 100 and the buried dielectric layer 220. The pixel isolation pattern 200 may be adhered through the adhesive layer 150 to the substrate 100. The adhesive layer 150 may include a dielectric material such as a silicon-based dielectric material or a dielectric polymer. For example, the adhesive layer 150 may include the same material as that of the buried dielectric layer 220. In some example embodiments, the adhesive layer 150 and the buried dielectric layer 220 may be connected to each other without an interface therebetween. For another example, the adhesive layer 150 may include an eutectic glue material such as AuSn or NiSi.

The partition 500 may define pixel openings 691 and 692. For example, the pixel openings 691 and 692 may be provided in and surrounded by the partition 500. The partition 500 may separate the pixel openings 691 and 692 from each other. As shown in FIG. 1B, the partition 500 may be provided on the pixel isolation pattern 200 in the first opening 291. The partition 500 may be provided on and in physical contact with an uppermost top surface 200a of the pixel isolation pattern 200. For example, as shown in FIGS. 1C and 1D, the partition 500 may be in contact with an uppermost top surface 210a of the liner layer 210. The partition 500 may include a dielectric material. The partition 500 may include, for example, one or more of silicon (Si), silicon carbide (SiC), sapphire, and gallium nitride (GaN). The partition 500 may further extend onto a stack structure 300S. The partition 500 may be formed of a silicon substrate.

The partition 500 may include a first partition 510 (for example, a partition wall, or a partition wall structure) and a second partition 520 (for example, a partition wall, or a partition wall structure). The first partition 510 may be provided between two neighboring fluorescent layers 610 and 620. As shown in FIG. 1A, the first partition 510 may include segments extending in the first direction D1 and other segments extending in the second direction D2. The second partition 520 may correspond to an outermost part of the partition 500. For example, the second partition 520 and the first partition 510 may be formed of the same material and connected to each other without an interface therebetween. When viewed in plan, the second partition 520 may be provided between the pixel array and the connection pads 460. The second partition 520 may surround the fluorescent layers 610 and 620. The second partition 520 may serve to protect the fluorescent layers 610 and 620. For example, even when external stress is applied to the light emitting device 2000, the second partition 520 may reduce or prevent damage of the fluorescent layers 610 and 620 and the first partition 510. Therefore, the light emitting device 2000 may improve in durability and/or reliability. When the light emitting module 1 is used for an automotive headlamp, the external stress may include vibration and physical impact. At the same level, the second partition 520 may have a width greater than that of the first partition 510. For example, the second partition 520 may have a top surface at substantially the same level as that of a top surface of the first partition 510, and a width W20 at the top surface of the second partition 520 may be greater than a width W10 at the top surface of the first partition 510. The greater width W20 of the second partition 520 may effectively reduce or prevent damages of the fluorescent layers 610 and 620.

The partition 500 may have a trapezoidal cross-section. For example, the partition 500 may have a bottom surface whose width is greater than that at a top surface thereof. The partition 500 may allow the LED chips 300 to effectively discharge light outwardly. Consequently, the light emitting module 1 may improve in luminance efficiency.

The fluorescent layers 610 and 620 may be provided on corresponding LED chips 300. The fluorescent layers 610 and 620 may be provided in corresponding pixel openings 691 and 692. For example, the fluorescent layers 610 and 620 may include a first fluorescent layer 610 and a second fluorescent layer 620. The pixel openings 691 and 692 may include a first pixel opening 691 and a second pixel opening 692. The first fluorescent layer 610 may be provided in the first pixel opening 691, and the second fluorescent layer 620 may be provided in the second pixel opening 692. The fluorescent layers 610 and 620 may correspondingly fill the pixel openings 691 and 692. For example, the first fluorescent layer 610 may fill the first pixel opening 691, and the second fluorescent layer 620 may fill the second pixel opening 692. When viewed in plan, the fluorescent layers 610 and 620 may overlap corresponding pixels PX1 and PX2. For example, the first fluorescent layer 610 may overlap the first pixel PX1, and the second fluorescent layer 620 may overlap the second pixel PX2. The first partition 510 may separate the fluorescent layers 610 and 620 from each other.

When the light emitting device 2000 operates, the fluorescent layers 610 and 620 may correspondingly convert light emitted from the LED chips 300 into light of desired wavelengths. The first fluorescent layer 610 may convert light of a certain wavelength emitted from a corresponding LED chip 300 into light of a wavelength different from the certain wavelength. For example, the first fluorescent layer 610 may covert light of a certain wavelength into light of a first wavelength. The first wavelength may be different from the certain wavelength. The light of the first wavelength may produce a first color. Thus, the first pixel PX1 of the light emitting device 2000 may produce the first color. The first color may be different from colors of light emitted from the LED chips 300. The second fluorescent layer 620 may include a different material from that of the first fluorescent layer 610. The second fluorescent layer 620 may convert light (e.g., of a certain wavelength) emitted from a corresponding LED chip 300 into light of a second wavelength. The second wavelength may be different from the certain wavelength. The second wavelength may be different from the first wavelength. The light of the second wavelength may produce a second color different from the first color. The second color may be different from colors of light emitted from the LED chips 300. The second pixel PX2 of the light emitting device 2000 may produce the second color. In conclusion, the light emitting device 2000 may achieve multiple colors. For example, one of the first and second colors may be white, and the other of the first and second colors may be amber. However, the first and second colors are not limited to the above, but may be variously changed. For example, the first color may be one selected from red, green, and blue, and the second color may be another selected from red, green, and blue.

When a light emitting device (e.g., a light emitting chip or a light emitting package) produces a single color, it may be required that the light emitting module 1 have a plurality of light emitting devices that produce different colors from each other. In certain embodiments, because the light emitting device 2000 produces a plurality of colors, the light emitting module 1 may use a single light emitting device 2000 as a light source. The light emitting module 1 may improve luminance efficiency. The light emitting module 1 and a light emitting apparatus including the same may reduce power consumption. Because the light emitting module 1 includes the single light emitting device 2000, the module substrate 1000 may decrease in size (e.g., planar area). As a result, the light emitting module 1 may have smaller size and/or weight.

The first partition 510 may separate the second fluorescent layers 620 from the first fluorescent layer 610. The first partition 510 may include a different material from that of the first fluorescent layer 610 and that of the second fluorescent layer 620. The first partition 510 may prevent or reduce optical interference between the pixels PX. Thus, when the light emitting module 1 operates, color (e.g., the second color) produced from the second pixel PX2 may be distinct from color (e.g., the first color) produced from the first pixel PX1. The light emitting module 1 may exhibit improved contrast characteristics.

Each of the fluorescent layers 610 and 620 may include a resin in which fluorescent materials are distributed. The fluorescent material may include one or more of oxide-based material, silicate-based material, nitride-based material, and fluoride-based material. For example, the fluorescent material may include one or more of β-SiAlON:Eu$^{2+}$ (green), (Ca,Sr)AlSiN$_3$:Eu$^{2+}$ (red), La$_3$Si$_6$N$_{11}$:Ce$^{3+}$ (yellow), K$_2$SiF$_6$:Mn$_4^+$ (red), SrLiAl$_3$N$_4$:Eu (red), Ln$_{4-x}$(Eu$_z$M$_{1-z}$)$_x$Si$_{12-y}$Al$_y$O$_{3+x+y}$N$_{18-x-y}$ (0.5≤x≤3, 0<z<0.3, 0<y≤4) (red), K$_2$TiF$_6$:Mn$_4^+$ (red), NaYF$_4$:Mn$_4^+$ (red), and NaGdF$_4$:Mn$_4^+$ (red). However, the fluorescent material is not limited to those kinds discussed above.

For example, the fluorescent materials included in each of the fluorescent layers 610 and 620 may be the same. For another example, one or more of the fluorescent layers 610 and 620 may include at least two kinds of fluorescent particles whose sizes are different from each other. In some example embodiments, the fluorescent layers 610 and 620 may have improved chromatic uniformity. The fluorescent layers 610 and 620 may include a wavelength conversion material. The wavelength conversion material may convert light of a certain wavelength emitted from the LED chips 300. For example, the wavelength conversion material may include a quantum dot fluorescent material, which has a nano-sized particle. The quantum dot fluorescent material may use a III-V or II-VI compound semiconductor to have a core-shell structure. For example, the core may include CdSe and/or InP. The shell may include ZnS and/or ZnSe. In addition, the quantum dot fluorescent material may include a ligand to increase stability of the core and the shell. Optionally, additional wavelength conversion particles may further be provided on an upper portion of one or more of the fluorescent layers 610 and 620.

A reflective layer 530 may further be provided on a sidewall of the partition 500. The reflective layer 530 may be interposed between the partition 500 and each of the fluorescent layers 610 and 620. The reflective layer 530 may reflect light emitted from the LED chip 300 to improve optical extraction efficiency of the light emitting device 2000. The reflective layer 530 may further prevent or reduce the optical interference between the pixels PX. For example, the reflective layer 530 may include a metallic material such as Ag, Al, Ni, Cr, Au, Pt, Pd, Sn, W, Rh, Jr, Ru, Mg, Zn, or a combination thereof. For another example, the reflective layer 530 may be a resin layer including metal oxide. The metal oxide may include titanium oxide or aluminum oxide. The resin layer may include polyphthalamide (PPA). For another example, the reflective layer 530 may be a distributed Bragg reflector (DBR). The distributed Bragg reflector may include a plurality of layers (not shown), one of which has a refractive index different from those of neighboring layers. The distributed Bragg reflector may include one or more of oxide (e.g., SiO$_2$, TiO$_2$, Al$_2$O$_3$, and/or ZrO$_2$), nitride (e.g., SiN, Si$_3$N$_4$, TiN, AN, TiAlN, and/or TiSiN), and oxynitride (e.g., SiO$_x$N$_y$).

No reflective layer 530 may be provided on an outer wall of the second partition 520. The outer wall of the second partition 520 may face an inner wall of the second partition 520, and the inner wall of the second partition 520 may face the fluorescent layers 610 and 620. For another example, the light emitting device 2000 may include no reflective layer 530.

The light guide structure 3000 may be provided on the module substrate 1000. The light guide structure 3000 may include an optical pipe. For example, the light guide structure 3000 may have an elongated cylindrical waveguide. The light guide structure 3000 may have a closed-loop shape when viewed in plan as shown in FIG. 1A. When viewed in plan, the light guide structure 3000 may surround the light emitting device 2000. The light guide structure 3000 may have a diameter A1 the same as or greater than a maximum diameter A2 of the pixel array of the light emitting device 2000. The diameter A2 of the pixel array may indicate an interval between outer walls of outermost ones of the fluorescent layers 610 and 620, which outermost ones are arranged in the same direction. The diameter A2 of the pixel array may correspond to a diameter of a pixel array region. The pixel array region may include the pixels PX1 and PX2 and the first partition 510 between the pixels PX1 and PX2. The maximum diameter A2 of the pixel array may fall within a range from about 10 μm to about 50 mm. The diameter A1 of the light guide structure 3000 may mean a diameter in the same direction on which the pixel array has the maximum diameter A2. The diameter A1 of the light guide structure 3000 may denote a diameter that is measured at a bottom surface 3000b of the light guide structure 3000. The bottom surface 3000b of the light guide structure 3000 may face the light emitting device 2000 or the module substrate 1000. The light guide structure 3000 may concentrate or guide light emitted from the light emitting device 2000. The concentrated light may be outwardly discharged. The light guide structure 3000 may improve luminance efficiency of the light emitting module 1.

The diameter A1 of the light guide structure 3000 may depend on the number and size of light emitter included in the light emitting module 1. In certain embodiments, a single light emitter may be used to reduce the diameter A1 of the light guide structure 3000. Because the light emitting device 2000 is used as the light emitter, the diameter A1 of the light guide structure 3000 may further be reduced. Therefore, the light emitting module 1 may be more compact. The reduction in size of the light emitting module 1 may increase the degree of design freedom of a light emitting apparatus including the light emitting module 1.

The light guide structure 3000 may be spaced apart from the light emitting device 2000. The light guide structure 3000 and the light emitting device 2000 may have therebetween an interval D10 ranging from about 0.1 mm to about 5 mm, more narrowly from about 0.3 mm to about 2 mm, and even more narrowly from about 0.5 mm to about 1 mm. When the interval D10 between the light guide structure 3000 and the light emitting device 2000 is less than about 0.1 mm, the light guide structure 3000 may be carbonized due to heat generated from the light emitting device 2000 during its operation. In some example embodiments, a light guide function of the light guide structure 3000 may be reduced to decrease luminance efficiency of the light emitting module 1. When the interval D10 between the light guide structure 3000 and the light emitting device 2000 is greater than about 5 mm, the light guide structure 3000 may insufficiently guide light emitted from the light emitting device 2000. In some example embodiments, the light emitting device 2000 may generate optical leakage to reduce luminance efficiency of the light emitting module 1.

For example, an air layer, air gap, or air space may be provided between the light guide structure 3000 and the light emitting device 2000. The air layer may have a thickness of about 0.1 mm to about 5 mm. For another example, a resin layer (not shown) may be provided between the light guide structure 3000 and the light emitting device 2000. The resin layer may include the same material as that of the light guide structure 3000. The resin layer may be transparent. The resin layer may have a thickness of about 0.1 mm to about 5 mm.

The light guide structure 3000 may include a polymer such as polycarbonate (PC) and/or polymethylmethacrylate (PMMA). The light guide structure 3000 may be relatively transparent, but the present inventive concepts are not limited thereto.

The following will now describe in detail the light emitting device 2000 with reference to FIGS. 1C and 1D.

Referring to FIGS. 1A, 1B, 1C, and 1D, the stack structure 300S may include a first semiconductor layer 310, an active layer 330, and/or a second semiconductor layer 320. Each of the LED chips 300 may be a portion of the stack structure 300S. For example, the LED chips 300 may be portions of the stack structure 300S, which portions are defined by the pixel isolation pattern 200. Each of the LED chips 300 may include the first semiconductor layer 310, the active layer 330, and/or the second semiconductor layer 320 that are stacked. The first semiconductor layer 310 may have a first conductive type. The first semiconductor layer 310 may include gallium nitride (GaN) doped with a p-type dopant. The p-type dopant may include magnesium (Mg). The second semiconductor layer 320 may have a second conductive type, which is different from the first conductive type. The second semiconductor layer 320 may include gallium nitride (GaN) doped with an n-type dopant. The n-type dopant may include silicon (Si). A buffer layer (not shown) may further be interposed between the second semiconductor layer 320 and the partition 500. The buffer layer (not shown) may relieve a lattice mismatch between the partition 500 and the second semiconductor layer 320. The active layer 330 may be interposed between the first semiconductor layer 310 and the second semiconductor layer 320. The active layer 330 may include a material having a multiple quantum well (MQW) in which at least one quantum well layer and at least one quantum barrier layer are alternately stacked. For example, the active layer 330 may include gallium nitride (GaN) and indium gallium nitride (InGaN) that are alternately stacked. A material and composition of the active layer 330 may control a peak wavelength of light emitted from the LED chips 300.

A first electrode pattern 410 and a second electrode pattern 420 may be provided on each of the LED chips 300. The first electrode pattern 410 may include a first upper electrode pattern 411 and/or a first lower electrode pattern 412. The first upper electrode pattern 411 may be disposed on the bottom surface of the LED chip 300, for example, on a bottom surface of the first semiconductor layer 310, and may be electrically connected to the first semiconductor layer 310. The first lower electrode pattern 412 may be provided on a bottom surface of the first upper electrode pattern 411, and may be electrically connected to the first upper electrode pattern 411.

The second electrode pattern 420 may include a second upper electrode pattern 421 and/or a second lower electrode pattern 422. The second upper electrode pattern 421 may be provided in the first semiconductor layer 310 and the active layer 330, and may be electrically connected to the second semiconductor layer 320. The second lower electrode pattern 422 may be provided on a bottom surface of the second upper electrode pattern 421, and may be electrically connected to the second upper electrode pattern 421.

A dielectric layer 205 may be interposed between the second upper electrode pattern 421 and the first semiconductor layer 310 and between the second upper electrode pattern 421 and the active layer 330. Thus, the second upper electrode pattern 421 may be insulated from the first semiconductor layer 310 and the active layer 330. The dielectric layer 205 may extend onto the bottom surface of the first semiconductor layer 310. The dielectric layer 205 may be interposed between the first upper electrode pattern 411 and the second upper electrode pattern 421. Thus, the second upper electrode pattern 421 may be insulated from the first upper electrode pattern 411. The liner layer 210 may be interposed between the first lower electrode pattern 412 and the second lower electrode pattern 422, and thus second lower electrode pattern 422 may be insulated from the first lower electrode pattern 412. The active layer 330 may receive electrical signals applied to the first electrode pattern 410 and the second electrode pattern 420. Therefore, recombination of electrons and holes may occur in the active layer 330, which may result in generation of light. The first electrode pattern 410 and the second electrode pattern 420 may have a high reflectance. The first electrode pattern 410 and the second electrode pattern 420 may each include a conductive material such as metal or transparent conductive oxide.

The pixel isolation pattern 200 may include the buried dielectric layer 220 and/or the liner layer 210. The liner layer 210 may conformally cover lateral and bottom surfaces of the LED chips 300. The liner layer 210 may be provided on an inner wall and a bottom surface of the first opening 291. Thus, the uppermost top surface 210a of the liner layer 210 may be located at substantially the same level as that of top surfaces of the LED chips 300. The top surface of each LED chip 300 may correspond to that of the second semiconductor layer 320. The liner layer 210 may cover a sidewall of the second opening 292, but may not cover a bottom surface of the second opening 292. The liner layer 210 may include, for example, a silicon-based dielectric material. The silicon-based dielectric material may include, for example, silicon oxide or silicon nitride. The buried dielectric layer 220 may be interposed between the substrate 100 and the liner layer 210, and may fill the first opening 291 and the second opening 292. The buried dielectric layer 220 may include a silicon resin, an epoxy resin, or an acryl resin.

In certain embodiments, the pixel isolation pattern 200 may be provided to reduce or prevent one of the LED chips 300 from receiving light emitted from a neighboring one of the LED chips 300. Therefore, the light emitting device 2000 may improve in contrast characteristics.

The light emitting device 2000 may be provided on its edge region with the second openings 292 that penetrate the stack structure 300S. The connection pads 460 may be provided in corresponding second openings 292. The connection pads 460 may have their top surfaces at substantially the same level as that of the top surface of the second semiconductor layer 320. The connection pads 460 may include a first connection pad 461 and a second connection pad 462. As shown in FIG. 1C, the first connection pad 461 may be provided in one of the second openings 292. A first line pattern 451 may be provided on a bottom surface of the first lower electrode pattern 412. The first line pattern 451 may extend between the buried dielectric layer 220 and the liner layer 210, and may be provided on the sidewall of the one of the second openings 292. Thus, the first lower electrode pattern 412 may be coupled through the first line pattern 451 to the first connection pad 461. The first line pattern 451 may include metal. For example, the first connection pad 461 may be provided in plural. The first line pattern 451 may be provided in plural. In some example embodiments, each of the first connection pads 461 may be coupled through a corresponding first line pattern 451 to the first lower electrode pattern 412 of a corresponding pixel PX.

As shown in FIG. 1D, the second connection pad 462 may be provided in another of the second openings 292. A second line pattern 452 may be provided on a bottom surface of the second lower electrode pattern 422, and coupled to the second lower electrode pattern 422. The second line pattern 452 may extend between the buried dielectric layer 220 and the liner layer 210, and may be provided on the another of the second opening 292. Thus, the second lower electrode pattern 422 may be coupled through the second line pattern 452 to the second connection pad 462. The second line pattern 452 may include, for example, metal. For example, the second connection pad 462 may be provided in plural. The second line pattern 452 may be provided in plural. Each of the second connection pads 462 may be coupled through a corresponding second line pattern 452 to the second lower electrode pattern 422 of a corresponding pixel PX. The second line pattern 452 may be insulated from the first line pattern 451. The second connection pads 462 may be spaced apart from and electrically separated from the first connection pads 461. For brevity of description, the following will describe an example including a single first connection pad 461 and a single second connection pad 462.

Figure 1E:
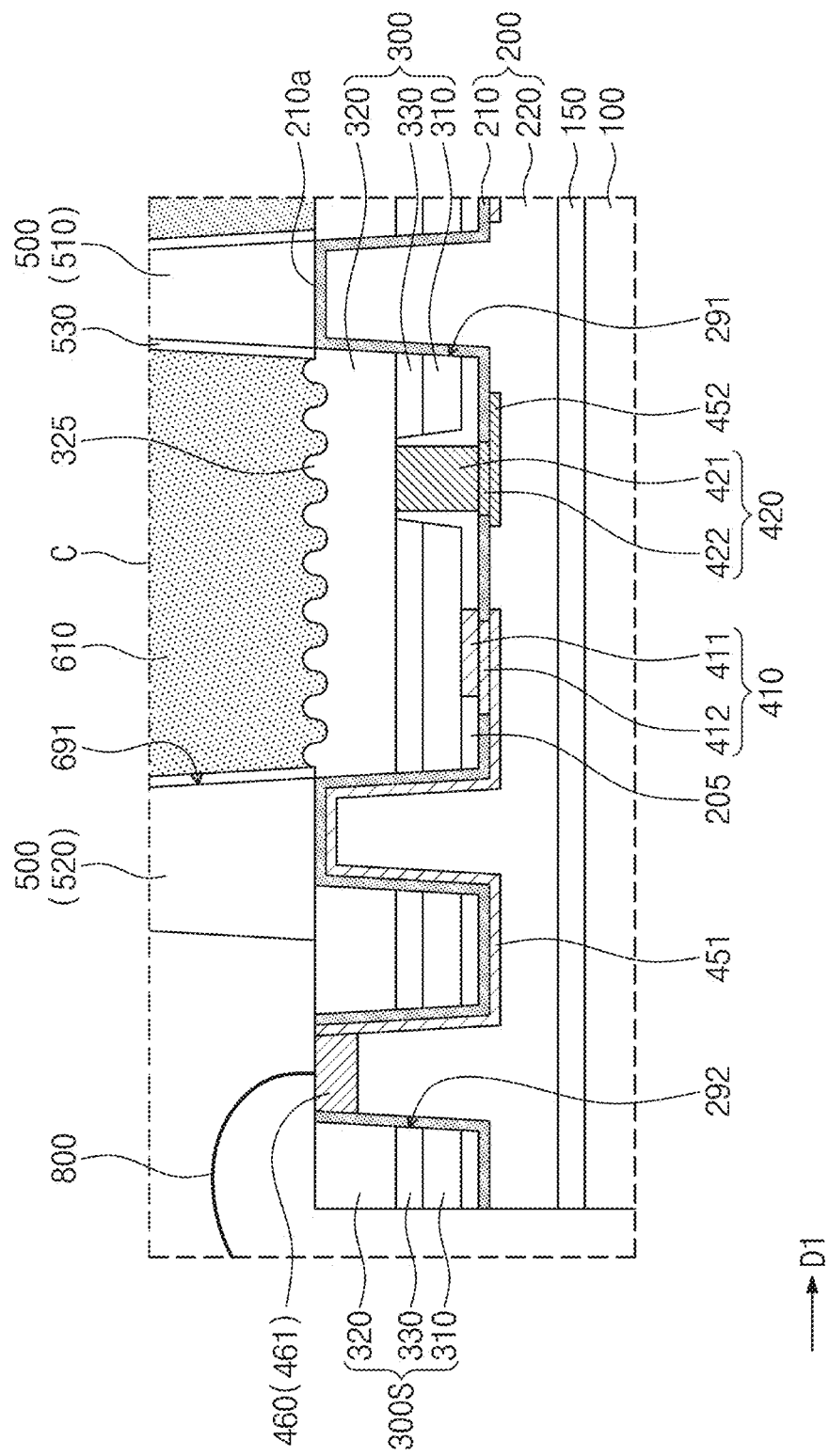
FIGS. 1E and 1F illustrate cross-sectional views showing a light emitting structure according to some example embodiments.
Figure 1F:
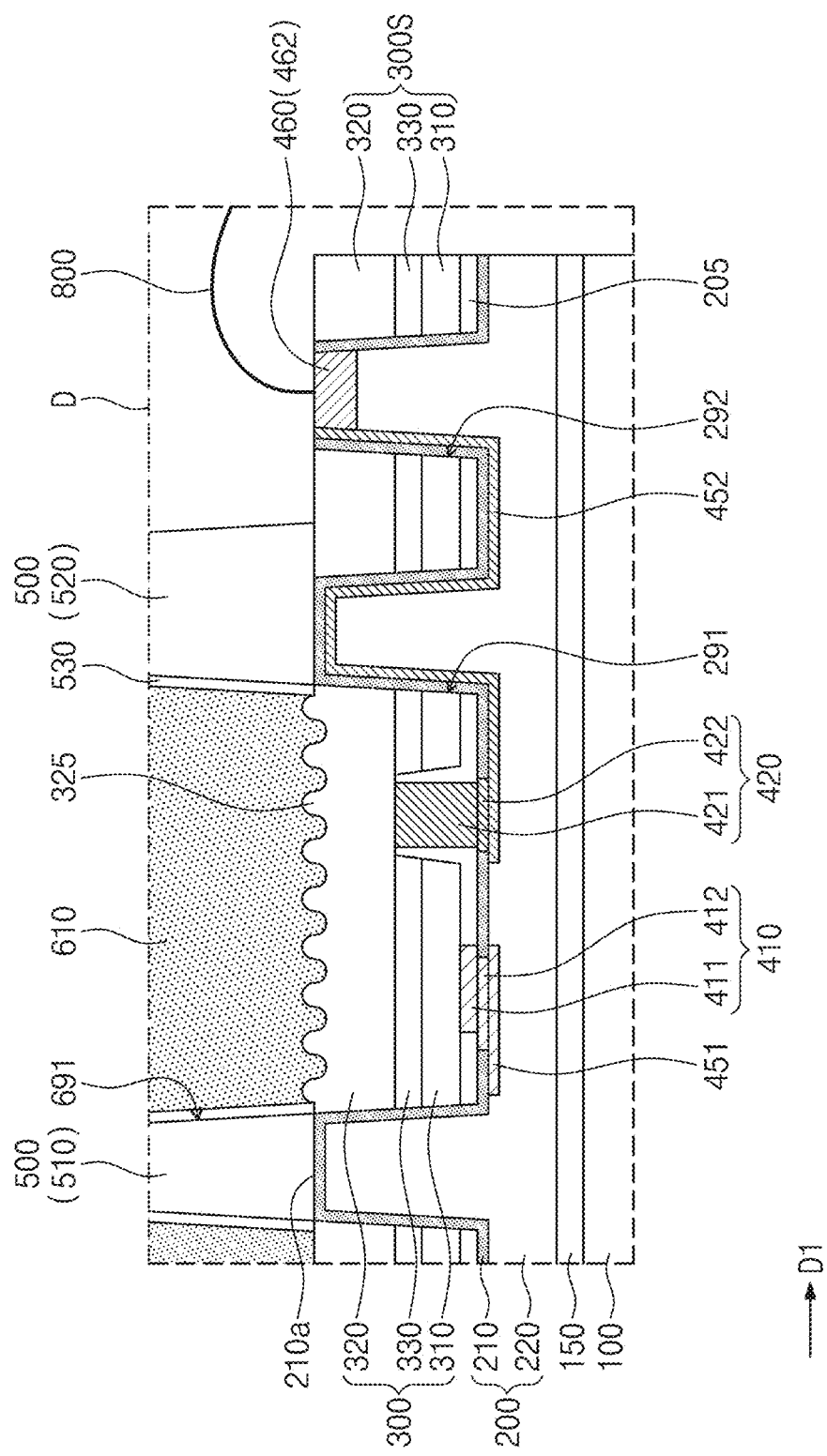

FIGS. 1E and 1F illustrate cross-sectional views showing a light emitting structure according to some example embodiments. FIG. 1C illustrates an enlarged view of section C shown in FIG. 1B. FIG. 1D illustrates an enlarged view of section D shown in FIG. 1B. A duplicate description of components discussed above will be omitted below.

Referring to FIGS. 1B, 1E, and 1F, the LED chip 300 may include the first semiconductor layer 310, the active layer 330, and/or the second semiconductor layer 320. The top surface of the LED chip 300 may have uneven portions 325 and correspond to the top surface of the second semiconductor layer 320. The uneven portions 325 may be in contact with the fluorescent layers 610 and 620. The fluorescent layers 610 and 620 may have their bottom surfaces whose shapes correspond to those of the uneven portions 325. The uneven portions 325 may improve luminance efficiency of the light emitting device 2000, for example, of the LED chips 300. In figures below, the illustration of the uneven portions 325 is omitted for brevity, but the present inventive concepts are not limited thereto.

Figure 2A:
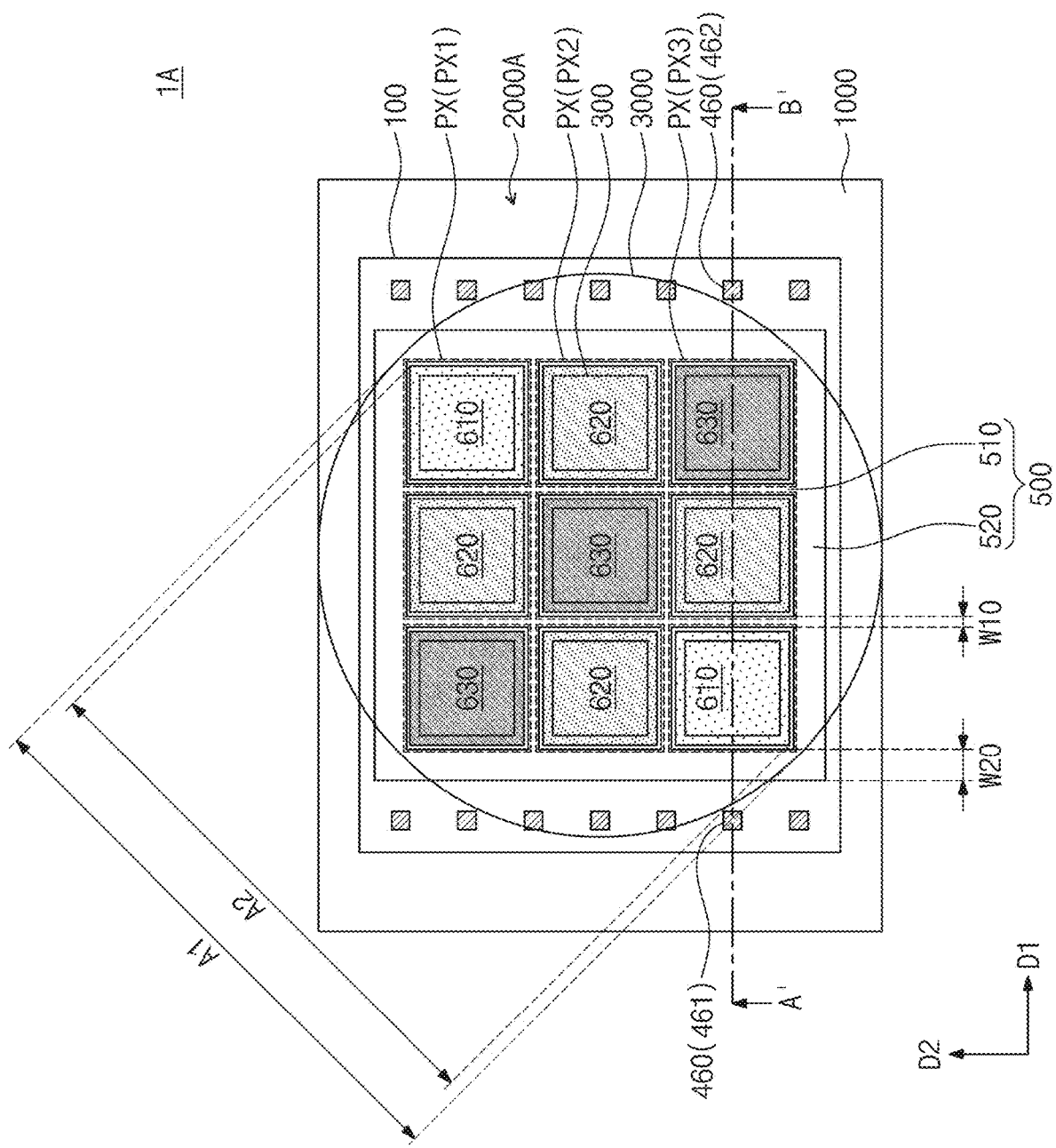
FIG. 2A illustrates a plan view showing a light emitting module according to some example embodiments.
Figure 2B:
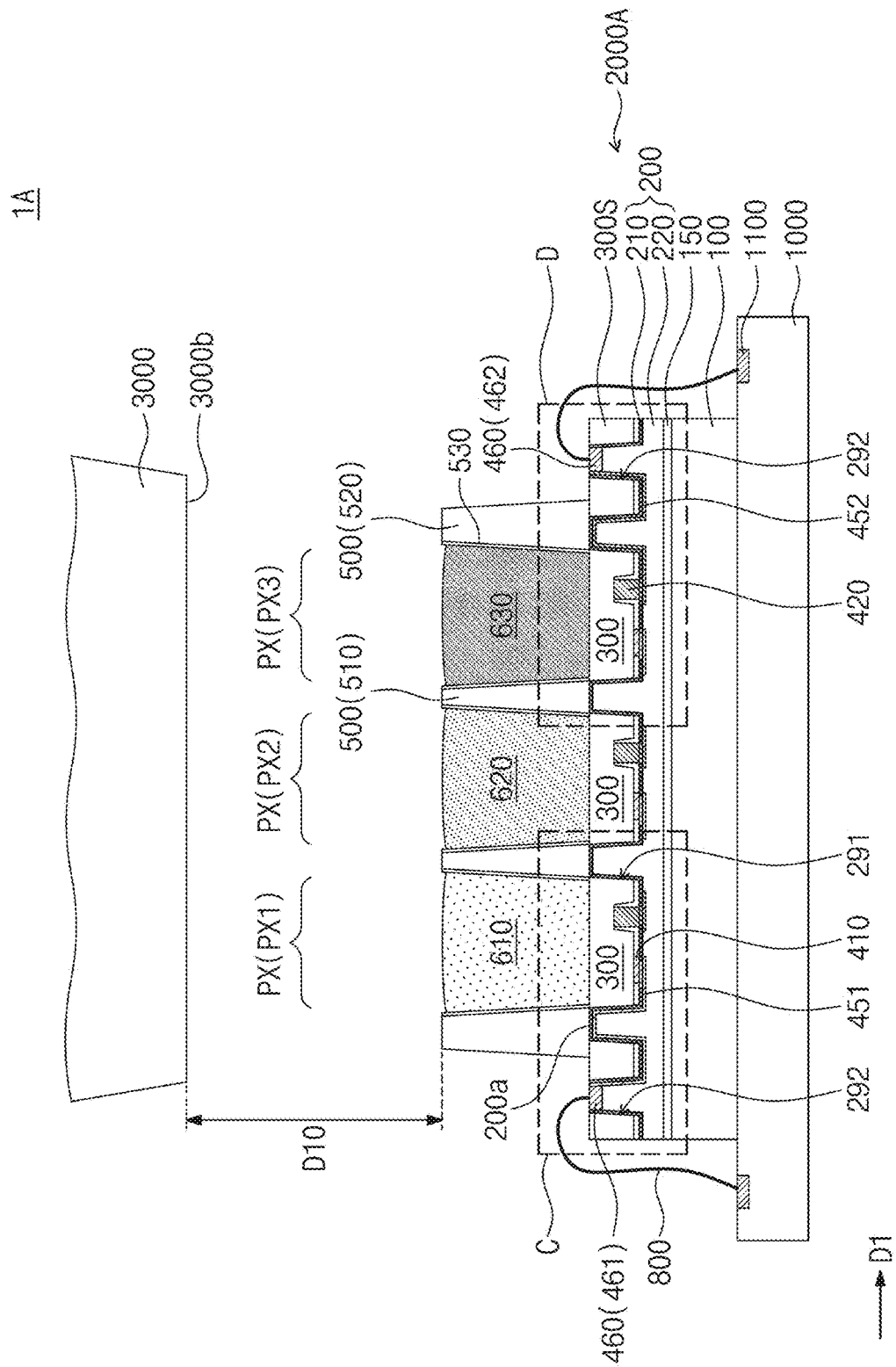
FIG. 2B illustrates a cross-sectional view taken along line A'-B' of FIG. 2A.

FIG. 2A illustrates a plan view showing a light emitting module according to some example embodiments. FIG. 2B illustrates a cross-sectional view taken along line A'-B' of FIG. 2A. A duplicate description of components discussed above will be omitted below.

Referring to FIGS. 2A and 2B, a light emitting module 1A may include a module substrate 1000, a light emitting device 2000A, and/or a light guide structure 3000. The module substrate 1000, the light emitting device 2000A, and the light guide structure 3000 may be substantially the same as those discussed above in FIGS. 1A and 1B. In contrast, when viewed in plan, the pixels PX of the light emitting device 2000A may include the first pixel PX1 and the second pixel PX2, and further include a third pixel PX3. The third pixel PX3 may be laterally spaced apart from the first pixel PX1 and the second pixel PX2.

The fluorescent layers 610 and 620 may include the first fluorescent layer 610 and the second fluorescent layer 620, and further include a third fluorescent layer 630. The third fluorescent layer 630 may be provided on the third pixel PX3. The third fluorescent layer 630 may convert light of a certain peak wavelength emitted from a corresponding LED chip 300 into light of a third wavelength. The third wavelength may be different from the certain peak wavelength. The third wavelength may be different from the first wavelength and the second wavelength. The light of the third wavelength may produce a third color. The third color may be different from colors of light emitted from the LED chips 300. The third color may be different from the first color and the second color. For example, the first color may be one selected from red, green, and blue, the second color may be another selected from red, green, and blue, and the third color may be the rest of red, green, and blue. However, the first, second, and third colors are not limited to the mentioned above, but may have various colors. In conclusion, the light emitting device 2000A may achieve various colors.

The following will now describe a method of fabricating a light emitting device according to some example embodiments.

FIGS. 3A to 3I illustrate cross-sectional views showing a method of fabricating a light emitting device according to some example embodiments. FIG. 3J illustrates an enlarged view of section E shown in FIG. 3H. In the description of FIGS. 3A to 3J, top and bottom surfaces and upper and lower portions of any component will be discussed on the basis of FIGS. 1B and 3I. FIG. 1A will also be referred in describing FIGS. 3A to 3I.

Figure 3A:
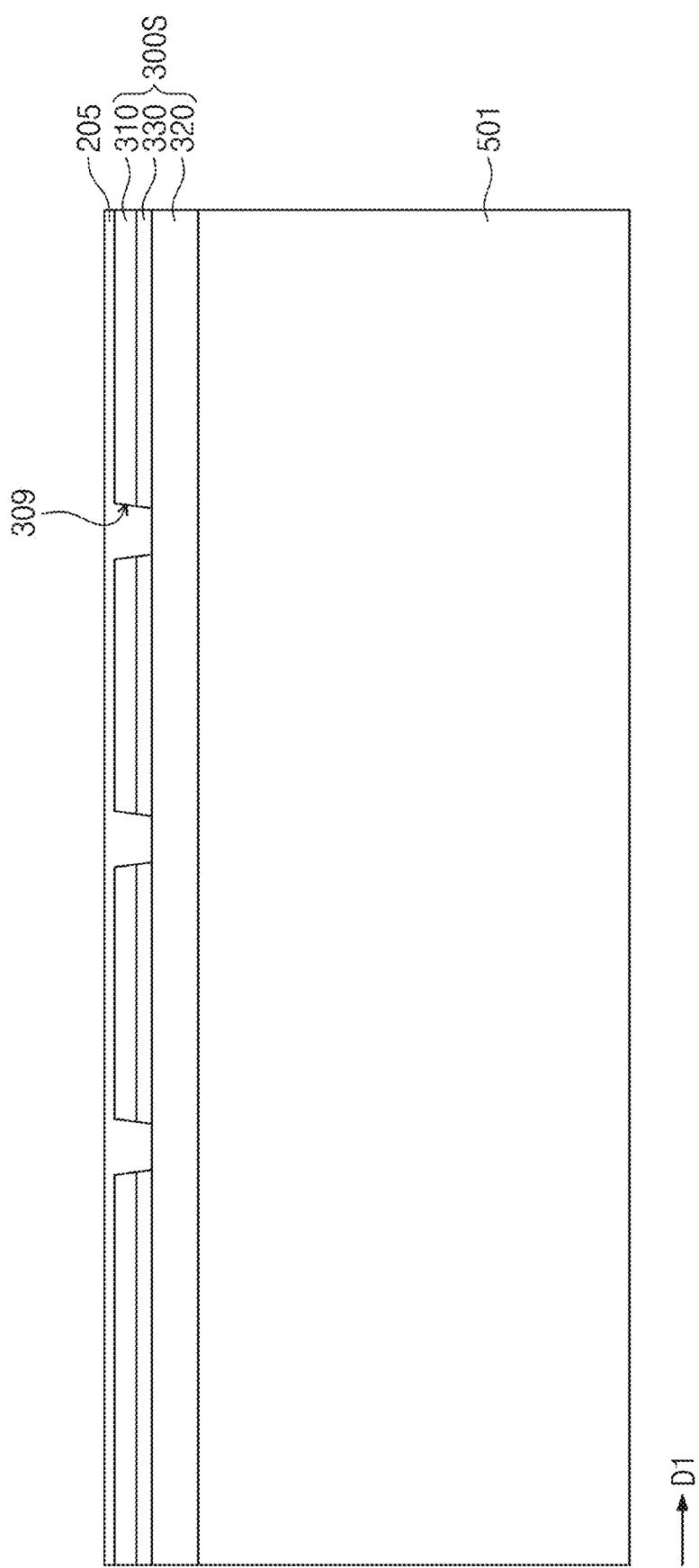

Referring to FIGS. 1A and 3A, a stack structure 300S may be formed on a support substrate 501. The support substrate 501 may include a silicon (Si) substrate, a silicon carbide (SiC) substrate, a sapphire substrate, or a gallium nitride (GaN) substrate. For example, a semiconductor wafer may be used as the support substrate 501. The support substrate 501 may serve as a growth substrate to form the stack structure 300S. A second semiconductor layer 320, an active layer 330, and a first semiconductor layer 310 may be sequentially formed on the support substrate 501, which may result in the formation of the stack structure 300S. The second semiconductor layer 320, the active layer 330, and the first semiconductor layer 310 may each include the same material as that discussed above in FIGS. 1A to 1D.

The stack structure 300S may be partially removed to form a hole 309 on each pixel PX. In FIGS. 3A to 3H, the pixel PX may be a virtual component corresponding to a pixel PX of a light emitting device 2001 shown in FIG. 3I. The formation of the hole 309 may include forming a mask pattern (not shown) on the first semiconductor layer 310 and performing an etching process in which the mask pattern is used as an etching mask. The hole 309 may be formed in the first semiconductor layer 310 and the active layer 330, and may expose the second semiconductor layer 320. A dielectric layer 205 may be formed on the first semiconductor layer 310 and in the hole 309.

Referring to FIGS. 1A and 3B, a first electrode hole 419 and a second electrode hole 429 may be formed in the dielectric layer 205. The second electrode hole 429 may be provided in the hole 309 and may expose the second semiconductor layer 320. The first electrode hole 419 may be provided in the dielectric layer 205 and may expose the first semiconductor layer 310. The second electrode hole 429 may be separated from the first electrode hole 419. A first upper electrode pattern 411 and a second upper electrode pattern 421 may be formed in the first electrode hole 419 and the second electrode hole 429, respectively.

A first lower electrode pattern 412 and a second lower electrode pattern 422 may be formed on the first upper electrode pattern 411 and the second upper electrode pattern 421, respectively. In certain embodiments, an electrode layer may be formed on the first upper electrode pattern 411, the second upper electrode pattern 421, and the dielectric layer 205. An electrolytic plating process may be performed to form the electrode layer. The electrode layer may be patterned to form the first lower electrode pattern 412 and the second lower electrode pattern 422. The second lower electrode pattern 422 may include the same material as that of the first lower electrode pattern 412, and have substantially the same thickness as that of the first lower electrode pattern 412. The second lower electrode pattern 422 may be spaced apart from and insulated from the first lower electrode pattern 412.

Figure 3C:
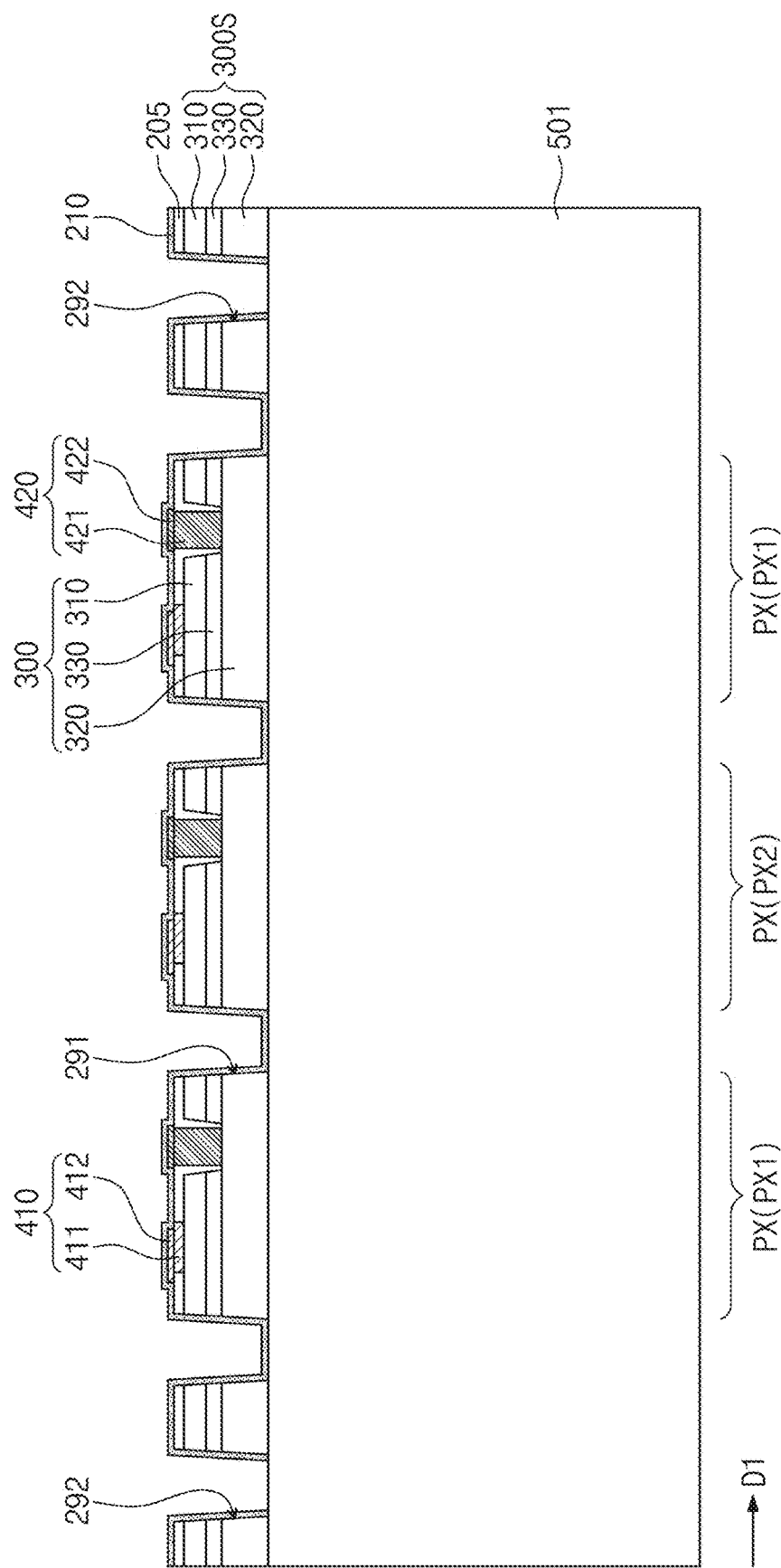

Referring to FIGS. 1A and 3C, a first opening 291 and second openings 292 may be formed in the stack structure 300S. The first opening 291 and the second openings 292 may be formed by partially removing the stack structure 300S. For example, a blade may be used to form the first and second openings 291 and 292. For another example, the formation of the first and second openings 291 and 292 may include forming a mask pattern on the dielectric layer 205 and performing an etching process in which the mask pattern is used as an etching mask. The first opening 291 and the second openings 292 may penetrate the stack structure 300S and expose the support substrate 501. The formation of the first opening 291 in the stack structure 300S may form light emitting diode (LED) chips 300. When viewed in plan, the first opening 291 may be formed a central region of the stack structure 300S. The LED chips 300 may be portions of the stack structure 300S, which portions are defined by the first opening 291. The first opening 291 may separate the LED chips 300 from each other. When viewed in plan, the second openings 292 may be formed an edge region of the stack structure 300S. The second openings 292 may be spaced apart from each other. The second openings 292 may be spaced apart from the first opening 291.

A liner layer 210 may be formed on the LED chips 300, in the first opening 291, and in the second openings 292. The liner layer 210 may conformally cover the first semiconductor layer 310, the first and second lower electrode patterns 412 and 422, the first opening 291, and the second openings 292. A liner layer 210 may be removed from bottom surfaces of the second openings 292. Thus, the liner layer 210 may expose the support substrate 501 in the second openings 292. The liner layer 210 may remain in the first opening 291 and cover the support substrate 501.

Figure 3D:
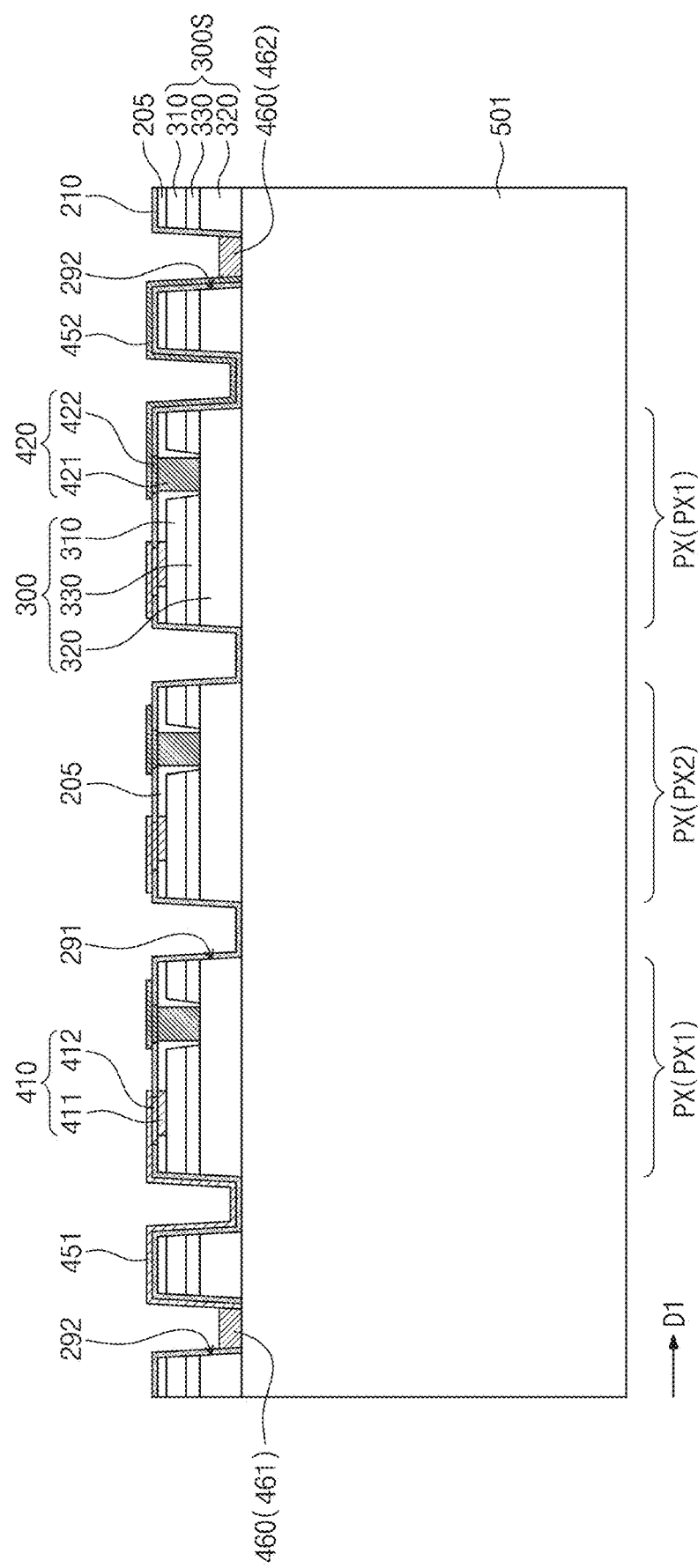

Referring to FIGS. 1A and 3D, the liner layer 210 may be partially removed to expose the first lower electrode pattern 412 and the second lower electrode pattern 422. A first line pattern 451 may be formed on the liner layer 210 to cover the exposed first lower electrode pattern 412. The first line pattern 451 may extend into one of the second openings 292. A second line pattern 452 may be formed on the liner layer 210 to cover the exposed second lower electrode pattern 422. The second line pattern 452 may extend into another of the second openings 292. For example, the formation of the first and second line patterns 451 and 452 may include forming a connection line layer on the liner layer 210, in the first opening 291, and in the second openings 292, and then performing a patterning process on the connection line layer. The second line pattern 452 and the first line pattern 451 may be formed by a single process. The patterning process may insulate and physically separate the second line pattern 452 from the first line pattern 451.

Connection pads 460 may be formed in corresponding second openings 292. An electrolytic plating process may be performed to form the connection pads 460. The connection pads 460 may be in physical contact with the support substrate 501 exposed to the second openings 292. The connection pads 460 may include a first connection pad 461 and a second connection pad 462. The first connection pad 461 may be provided in the one of the second openings 292 and coupled to the first line pattern 451. After the first line pattern 451 is formed, the first connection pad 461 may be formed. Alternatively, after the first connection pad 461 is formed, the first line pattern 451 may be formed. Dissimilarly, the first connection pad 461 and the first line pattern 451 may be formed by a single process.

The second connection pad 462 may be provided in the another of the second openings 292 and coupled to the second line pattern 452. The formation of the second connection pad 462 may be followed or preceded by the formation of the second line pattern 452. Alternatively, the second connection pad 462 and the second line pattern 452 may be formed by a single process.

Figure 3E:
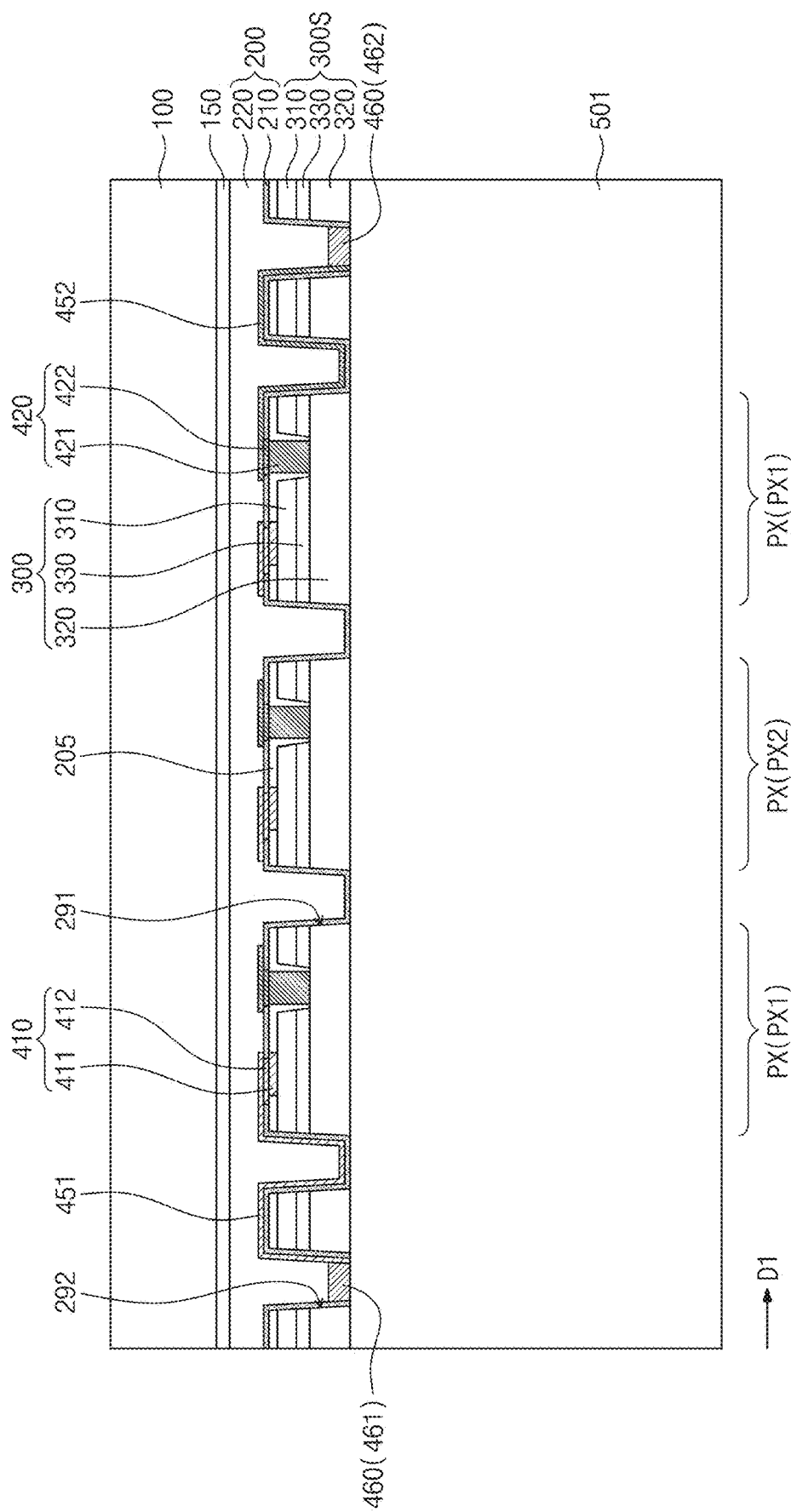

Referring to FIGS. 1A and 3E, a buried dielectric layer 220 may be formed on the liner layer 210, the first line pattern 451, the second line pattern 452, the first connection pad 461, and the second connection pad 462. The buried dielectric layer 220 may fill the first opening 291 and the second openings 292. The formation of the buried dielectric layer 220 may form a pixel isolation pattern 200 between the LED chips 300. The pixel isolation pattern 200 may include the liner layer 210 and the buried dielectric layer 220.

A substrate 100 may be disposed on the buried dielectric layer 220. An adhesive layer 150 may further be provided between the buried dielectric layer 220 and the substrate 100. The adhesive layer 150 may adhere the substrate 100 to the buried dielectric layer 220. The substrate 100 and the buried dielectric layer 220 may be substantially the same as those discussed above in FIGS. 1A and 1B.

Referring to FIGS. 1A and 3F, the stack structure 300S to which the substrate 100 is adhered may be turned upside down to cause the support substrate 501 to face upward. The support substrate 501 may be thinned as expressed by a dotted line. A grinding process may be performed to thin the support substrate 501.

Figure 3G:
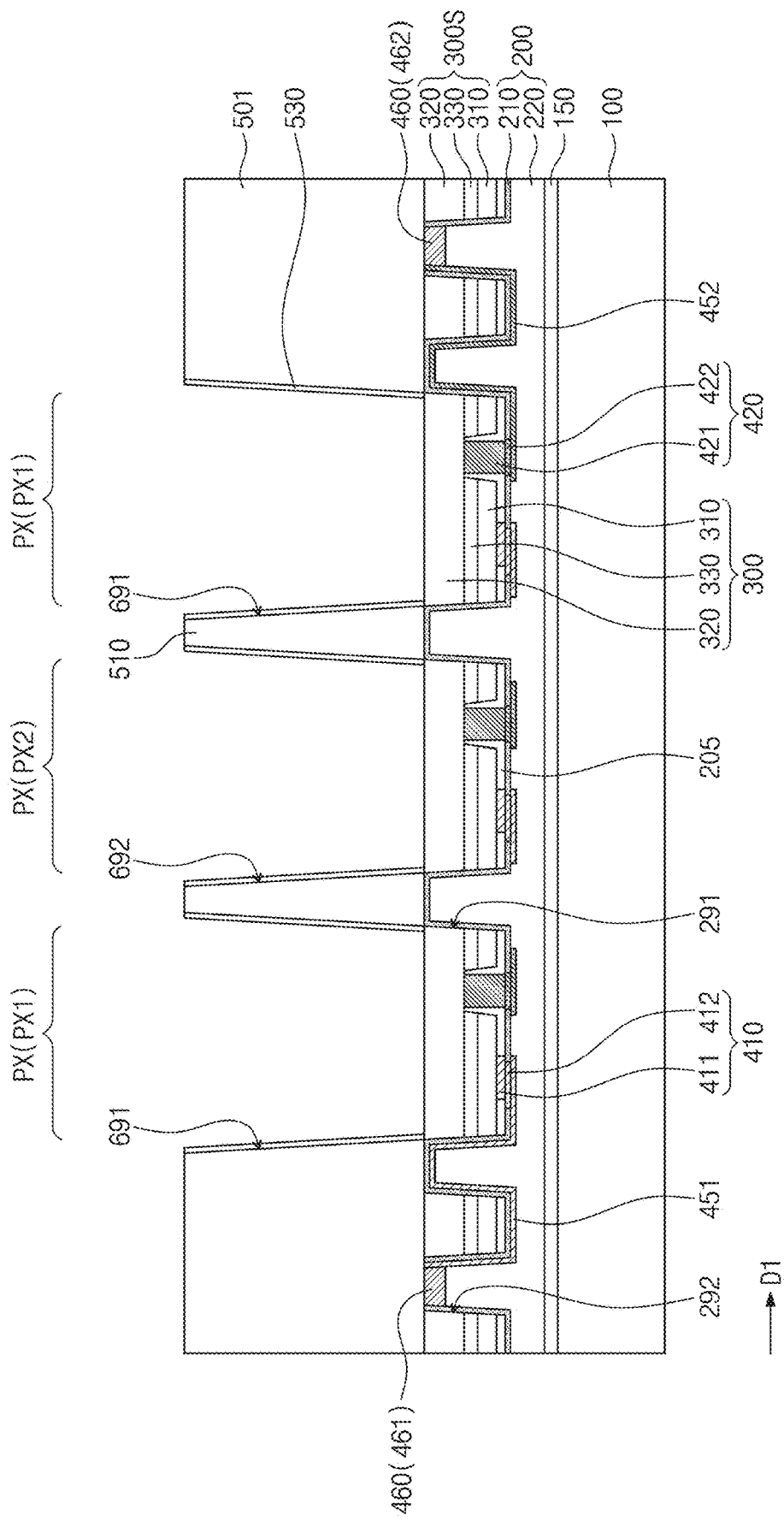

Referring to FIGS. 1A and 3G, the support substrate 501 may be etched to form a first partition 510 and pixel openings 691 and 692. The first partition 510 and the pixel openings 691 and 692 may be substantially the same as those discussed above in FIGS. 1A and 1B. For example, the first partition 510 and a remaining portion of the support substrate 501 may define the pixel openings 691 and 692. The pixel openings 691 and 692 may include a first pixel opening 691 and a second pixel opening 692. When viewed in plan, each of the pixel openings 691 and 692 may be formed on a corresponding one of pixels PX1 and PX2. For example, the first pixel opening 691 may be formed on a first pixel PX1, and the second pixel opening 692 may be formed on a second pixel PX2. The pixel openings 691 and 692 may expose a top surface of the second semiconductor layer 320. After the first partition 510 is formed, a portion of the support substrate 501 may remain to cover the first connection pad 461 and the second connection pad 462.

A reflective layer 530 may be formed on sidewalls of the pixel openings 691 and 692 to cover a sidewall of the first partition 510. The reflective layer 530 may further cover an inner wall of the support substrate 501. In certain embodiments, a preliminary reflective layer may be formed on sidewalls and bottom surfaces of the pixel openings 691 and 692, a top surface of the support substrate 501, and a top surface of the first partition 510. The preliminary reflective layer may be anisotropically etched to form the reflective layer 530. The reflective layer 530 may expose the bottom surfaces of the pixel openings 691 and 692, for example, the top surface of the second semiconductor layer 320. Alternatively, no reflective layer 530 may be formed.

Figure 3H:
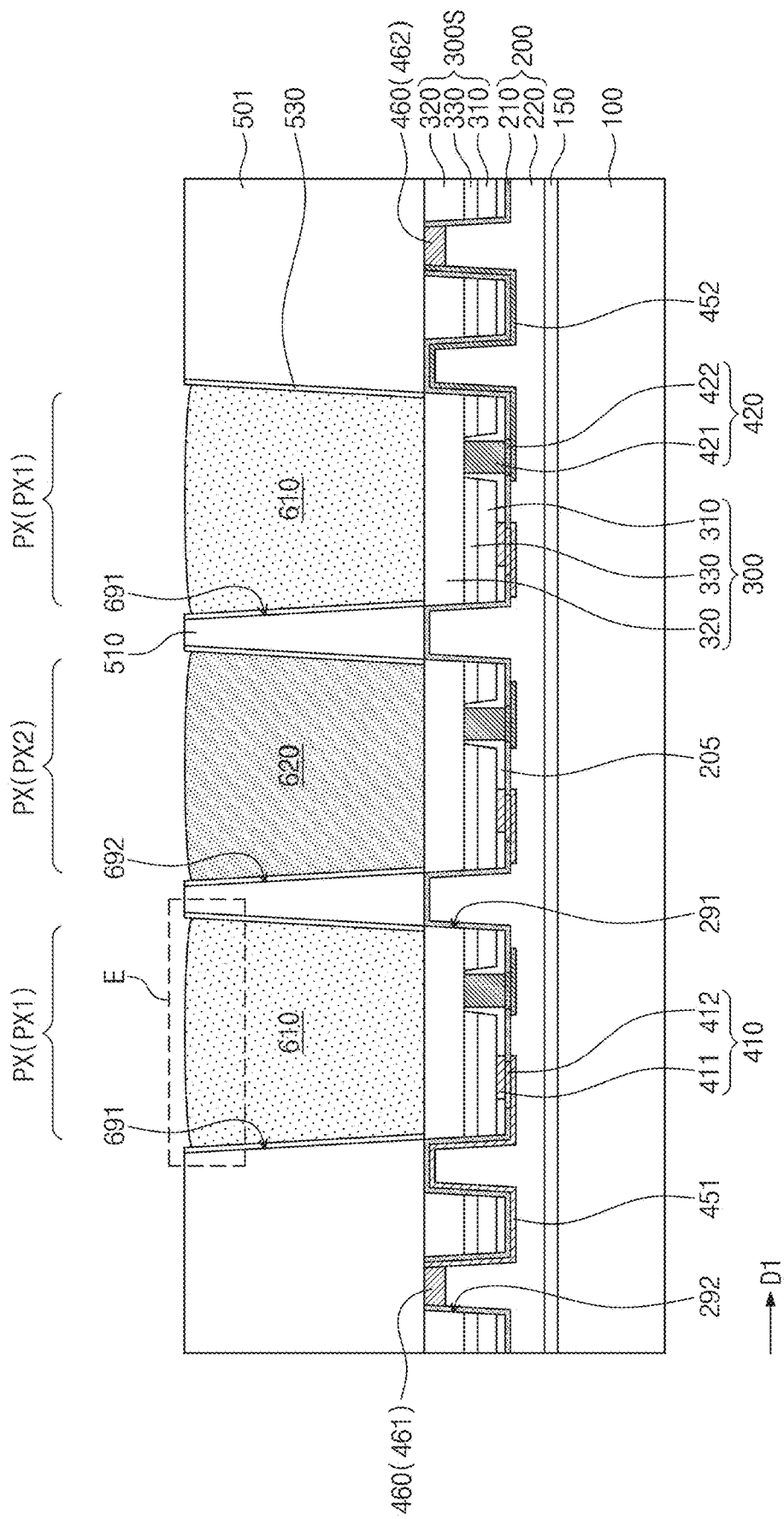
Figure 3I:
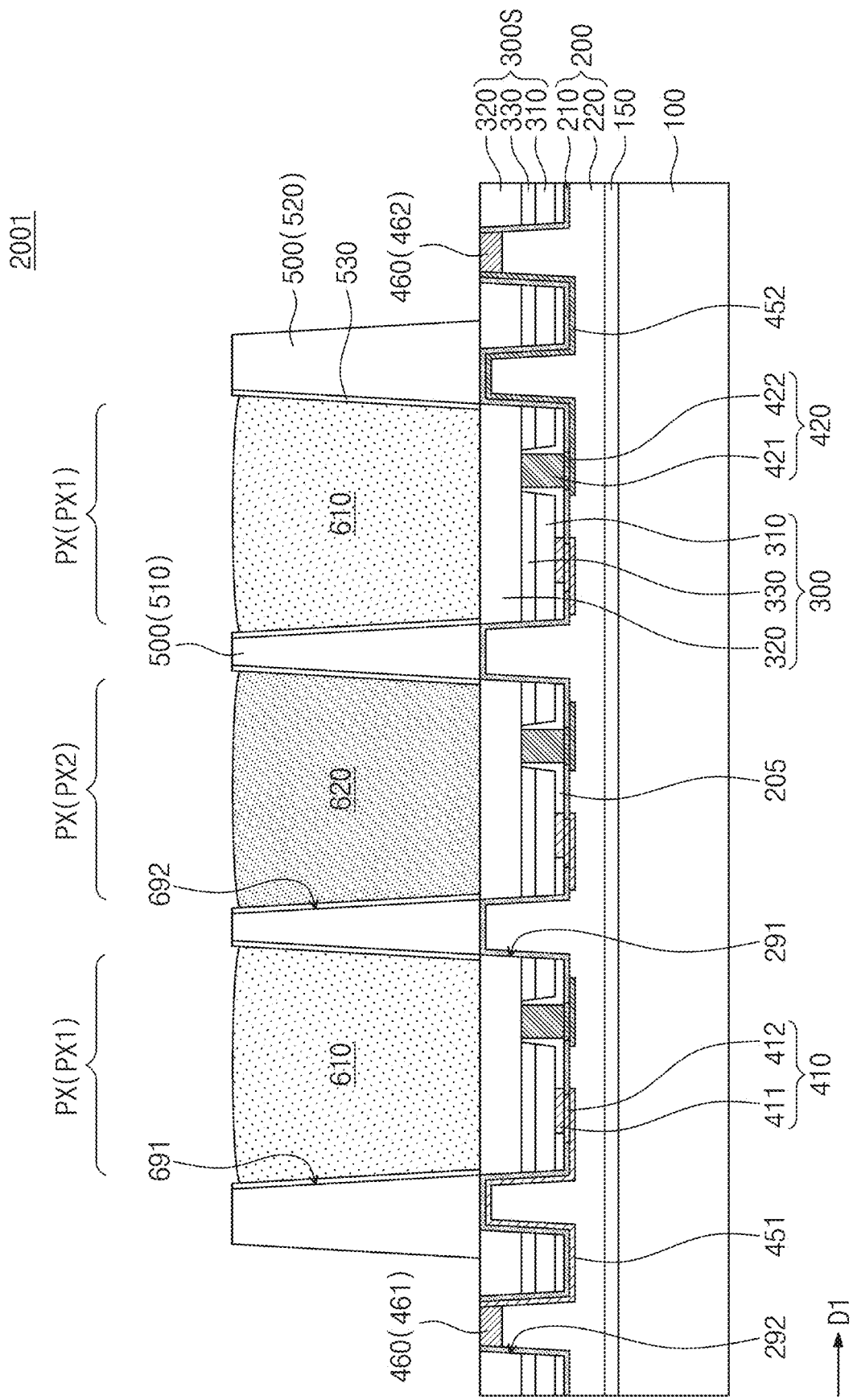
Figure 3J:
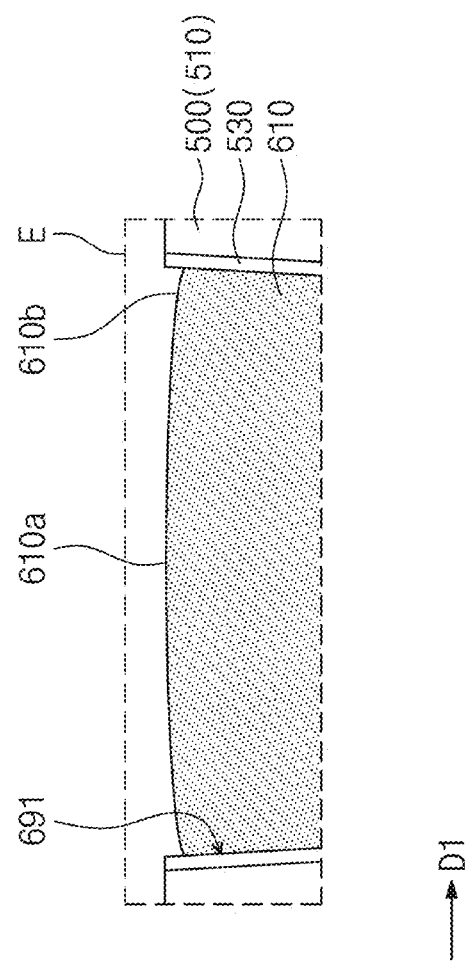
FIG. 3J illustrates an enlarged view of section E shown in FIG. 3H.

Referring to FIGS. 1A, 3H, and 3J, a first fluorescent layer 610 and a second fluorescent layer 620 may be formed in the first pixel opening 691 and the second pixel opening 692, respectively. For example, a dispensing process may be performed to provide the first pixel opening 691 with a first fluorescent material to form the first fluorescent layer 610. A dispensing process may be performed to provide the second pixel opening 692 with a second fluorescent material to form the second fluorescent layer 620. The second fluorescent material may be different from the first fluorescent material.

In certain embodiments, because the fluorescent layers 610 and 620 are formed by the dispensing process, each of the fluorescent layers 610 and 620 may have a central portion whose top surface is located at a higher level than that of a top surface at an edge portion of each of the fluorescent layers 610 and 620. For example, as shown in FIG. 3J, a top surface 610a at the central portion of the first fluorescent layer 610 may be located at a higher level than that of a top surface 610b of the edge portion of the first fluorescent layer 610. For the first fluorescent layer 610, the edge portion may be closer than the central portion to the partition 500. Likewise, a top surface at the central portion of the second fluorescent layer 620 may be located at a higher level than that of a top surface at the edge portion of the second fluorescent layer 620.

Referring to FIGS. 1A and 3I, the support substrate 501 may be etched to form a second partition 520. In certain embodiments, a mask pattern (not shown) may be formed on the first partition 510 and the first and second fluorescent layers 610 and 620. The support substrate 501 may undergo an etching process in which the mask pattern is used as an etching mask. The etching process may etch a portion of the support substrate 501 to form the second partition 520. The second partition 520 may expose the first connection pad 461 and the second connection pad 462. A partition 500 may thus be formed to include the first partition 510 and the second partition 520. The second partition 520 may correspond to an outermost part of the partition 500. As shown in FIG. 1A, the second partition 520 may be connected to the first partition 510. The second partition 520 may include the same material as that of the first partition 510. Through the processes discussed above, a light emitting device 2001 may eventually be fabricated.

Figure 4A:
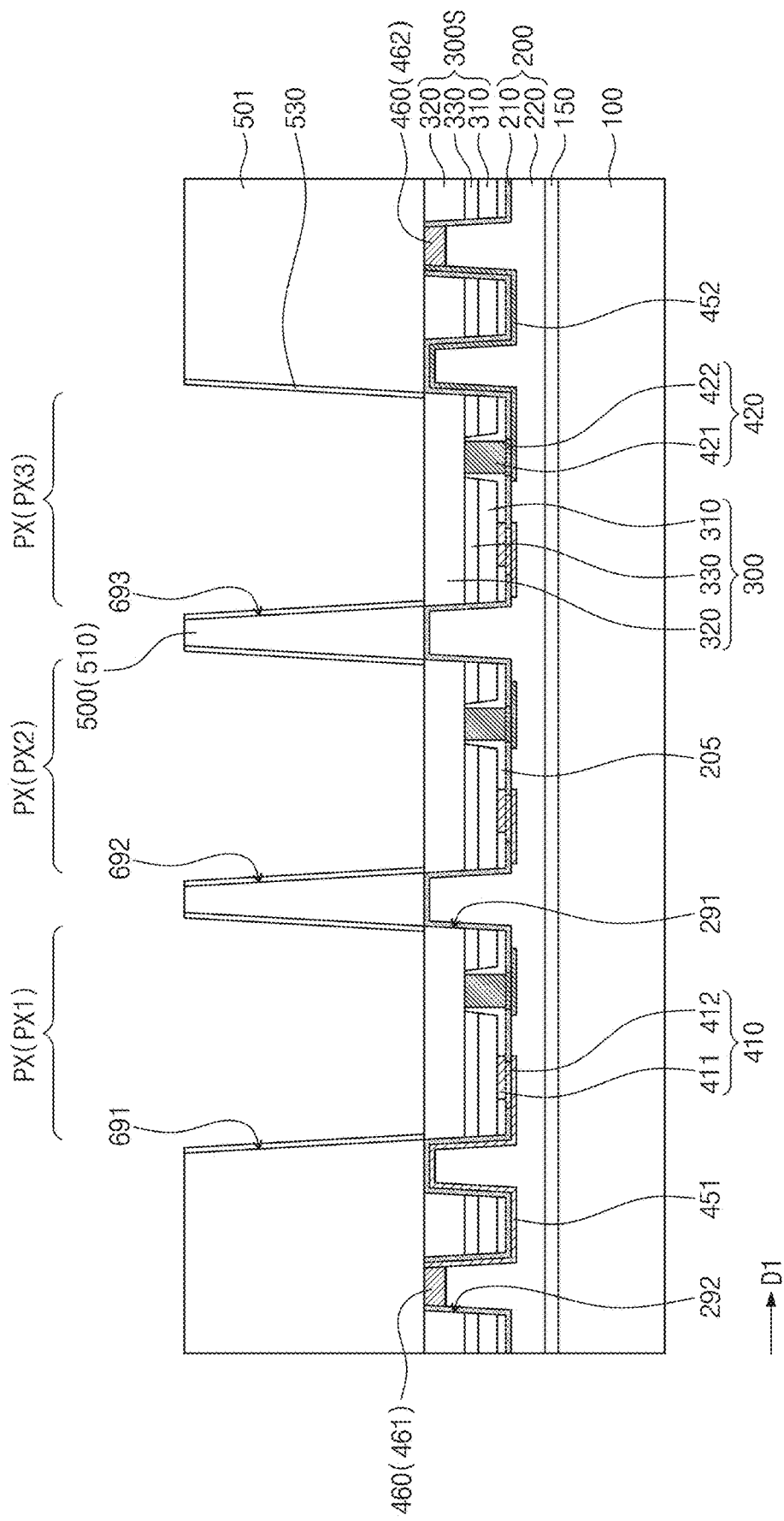
FIGS. 4A and 4B illustrate cross-sectional views showing a method of fabricating a light emitting device according to some example embodiments.
Figure 4B:
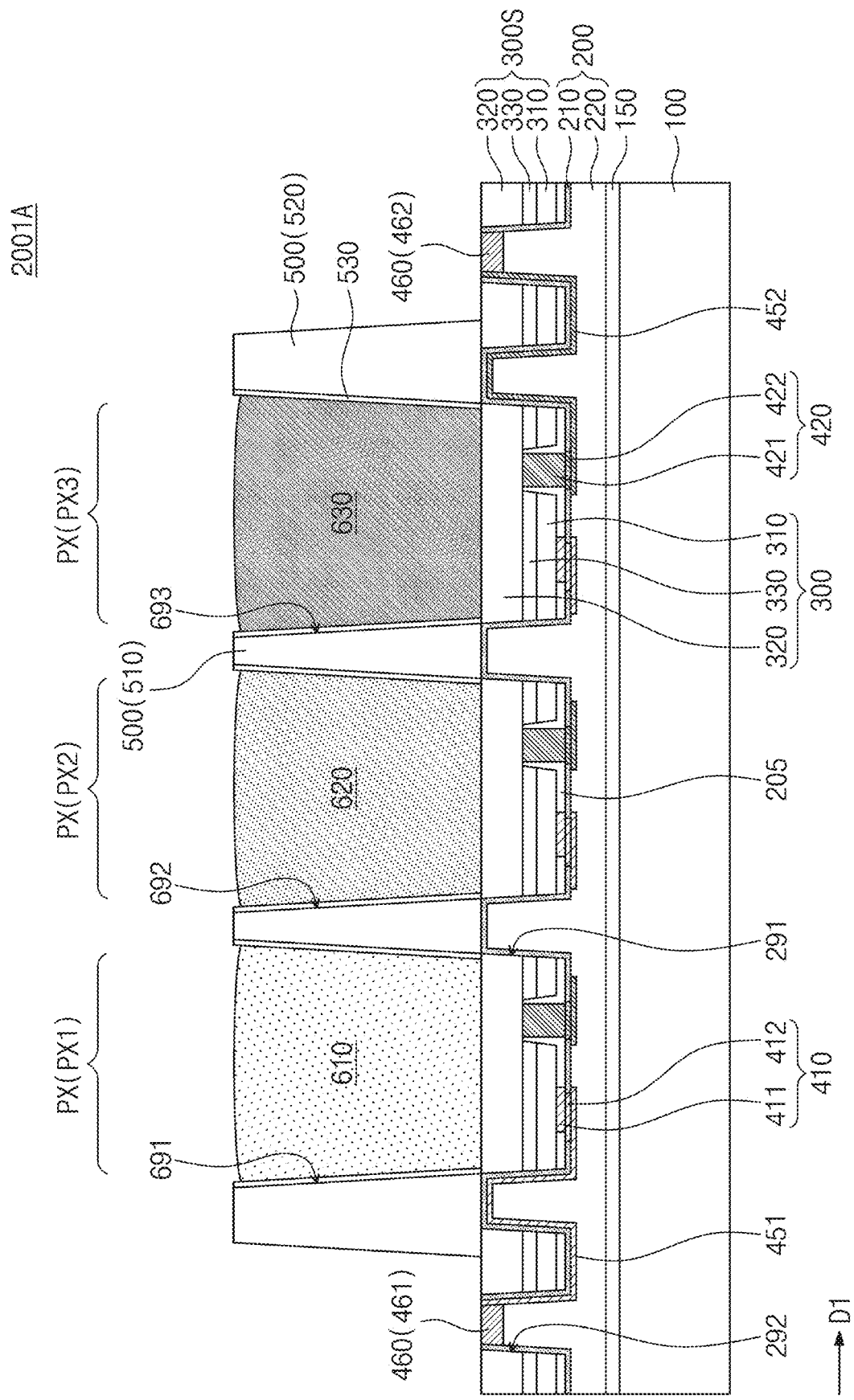

FIGS. 4A and 4B illustrate cross-sectional views showing a method of fabricating a light emitting device according to some example embodiments. A duplicate description of components discussed above will be omitted below. FIG. 2A will also be referred in describing FIGS. 4A and 4B.

Referring to FIGS. 2A and 4A, the LED chip 300, the dielectric layer 205, the first and second electrode patterns 410 and 420, the first and second line patterns 451 and 452, the connection pads 460, and the pixel isolation pattern 200 may be formed on the support substrate 501, and the substrate 100 may be provided on the pixel isolation pattern 200. The support substrate 501 may be etched to form the first partition 510 and the pixel openings 691 and 692. The formation of the LED chip 300, the dielectric layer 205, the first and second electrode patterns 410 and 420, the pixel isolation pattern 200, the first partition 510, and the first and second pixel openings 691 and 692 may be substantially the same as those discussed above in FIGS. 3A to 3G.

The pixel openings 691 and 692 may include the first pixel opening 691 and the second pixel opening 692, and further include a third pixel opening 693. The formation of the third pixel opening 693 may be substantially the same as the formation of the first and second pixel openings 691 and 692 of FIG. 3G. The reflective layer 530 may be formed sidewalls of the first, second, and third pixel openings 691, 692, and 693.

Referring to FIGS. 2A and 4B, the first fluorescent layer 610, the second fluorescent layer 620, and the third fluorescent layer 630 may be formed in the first pixel opening 691, the second pixel opening 692, and the third pixel opening 693, respectively. The first fluorescent layer 610 and the second fluorescent layer 620 may be formed by the dispensing process discussed above in FIG. 3H. A dispensing process may be performed to fill the third pixel opening 693 with a third fluorescent material to form the third fluorescent layer 630. The third fluorescent material may be different from the first fluorescent material and the second fluorescent material. The third fluorescent layer 630 may convert light emitted from the LED chip 300 into light of a third wavelength. The third wavelength may be different from the first wavelength and the second wavelength. Thus, the third pixel PX3 may produce a third color different from the first color produced from the first pixel PX1 and the second color produced from the second pixel PX2. A top surface at a central portion of the third fluorescent layer 630 may be located at a higher level than that of a top surface at an edge portion of the third fluorescent layer 630.

The support substrate 501 may be etched to form the second partition 520. The etching of the support substrate 501 and the formation of the second partition 520 may be substantially the same as those discussed above in FIG. 3I. The second partition 520 may expose the first connection pad 461 and the second connection pad 462. Through the processes discussed above, a light emitting device 2001A may eventually be fabricated. The light emitting device 2001A may produce three kinds of colors. For example, the light emitting device 2001A may achieve the first color, the second color, and the third color.

FIGS. 5A to 5F illustrate cross-sectional views showing a method of fabricating a light emitting device according to some example embodiments. FIG. 1A will also be referred in describing FIGS. 5A to 5F. A duplicate description of components discussed above will be omitted below.

Figure 5A:
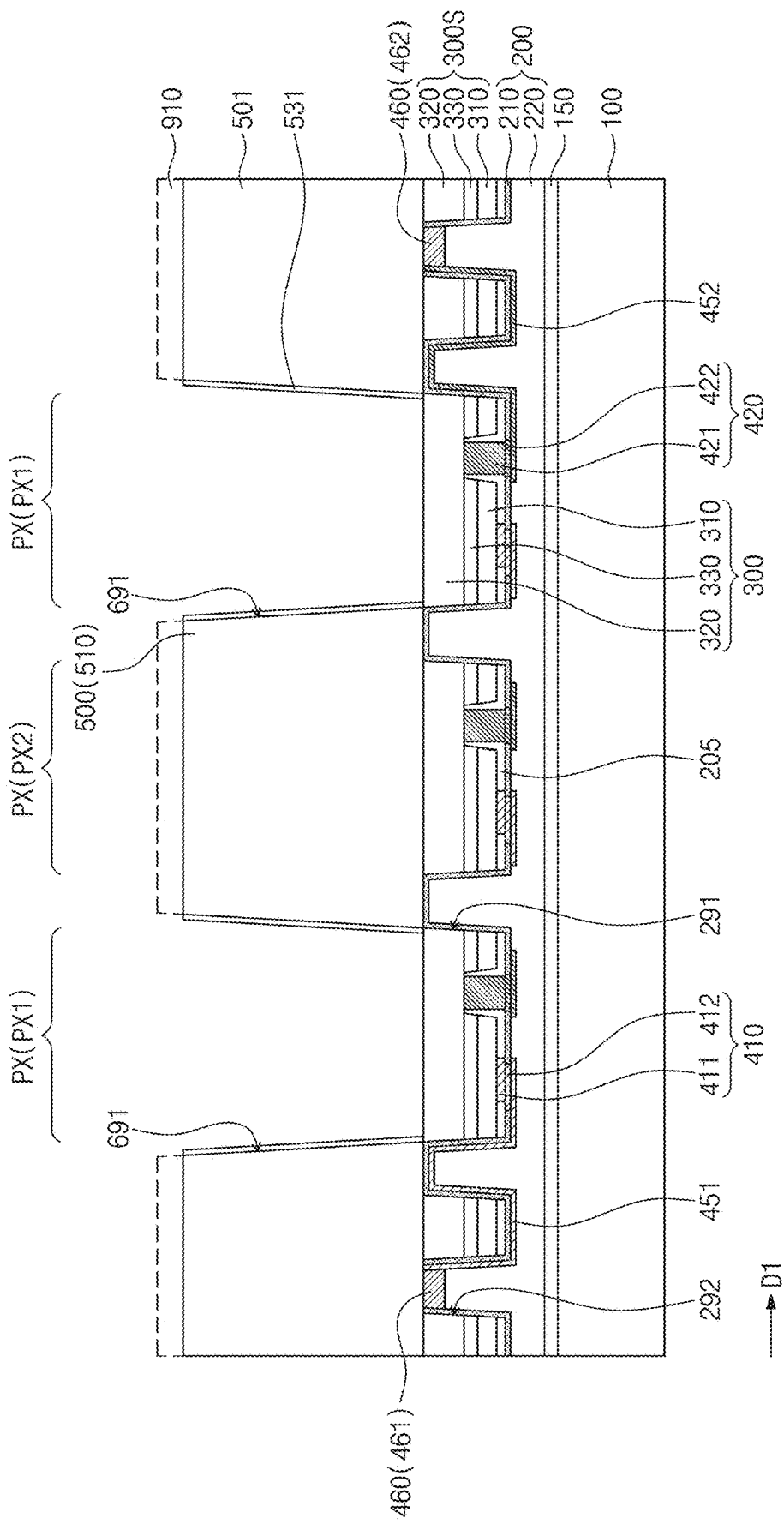
FIGS. 5A to 5F illustrate cross-sectional views showing a method of fabricating a light emitting device according to some example embodiments.

Referring to FIGS. 1A and 5A, the LED chip 300, the dielectric layer 205, the electrode patterns 410 and 420, the line patterns 451 and 452, the connection pads 460, the pixel isolation pattern 200, and the substrate 100 may be provided on the support substrate 501. The formation of the LED chip 300, the dielectric layer 205, the electrode patterns 410 and 420, the line patterns 451 and 452, the connection pads 460, the pixel isolation pattern 200 may be substantially the same as that discussed above in FIGS. 3A to 3F.

A first mask layer 910 may be formed on the support substrate 501 to expose the top surface of the support substrate 501. When viewed in plan, the first mask layer 910 may overlap the second pixel PX2. An etching process may be performed in which the first mask layer 910 is used as an etching mask to etch the support substrate 501 to form the first pixel opening 691 in the support substrate 501. The first pixel opening 691 may be provided on the first pixel PX1 and may expose the top surface of the second semiconductor layer 320. A first reflective layer 531 may be formed in the first pixel opening 691 and may cover the sidewall of the first pixel opening 691. The formation of the first reflective layer 531 may include forming a preliminary reflective layer to cover the sidewall and top surface of the first pixel opening 691 and performing a patterning process on the preliminary reflective layer. The patterning process may cause the first reflective layer 531 to expose the top surface of the second semiconductor layer 320. The first reflective layer 531 may include the same material as that of the reflective layer 530 discussed above in FIGS. 1A and 1B. The first pixel opening 691 may be provided in plural spaced apart from each other. The first mask layer 910 may be removed.

Figure 5B:
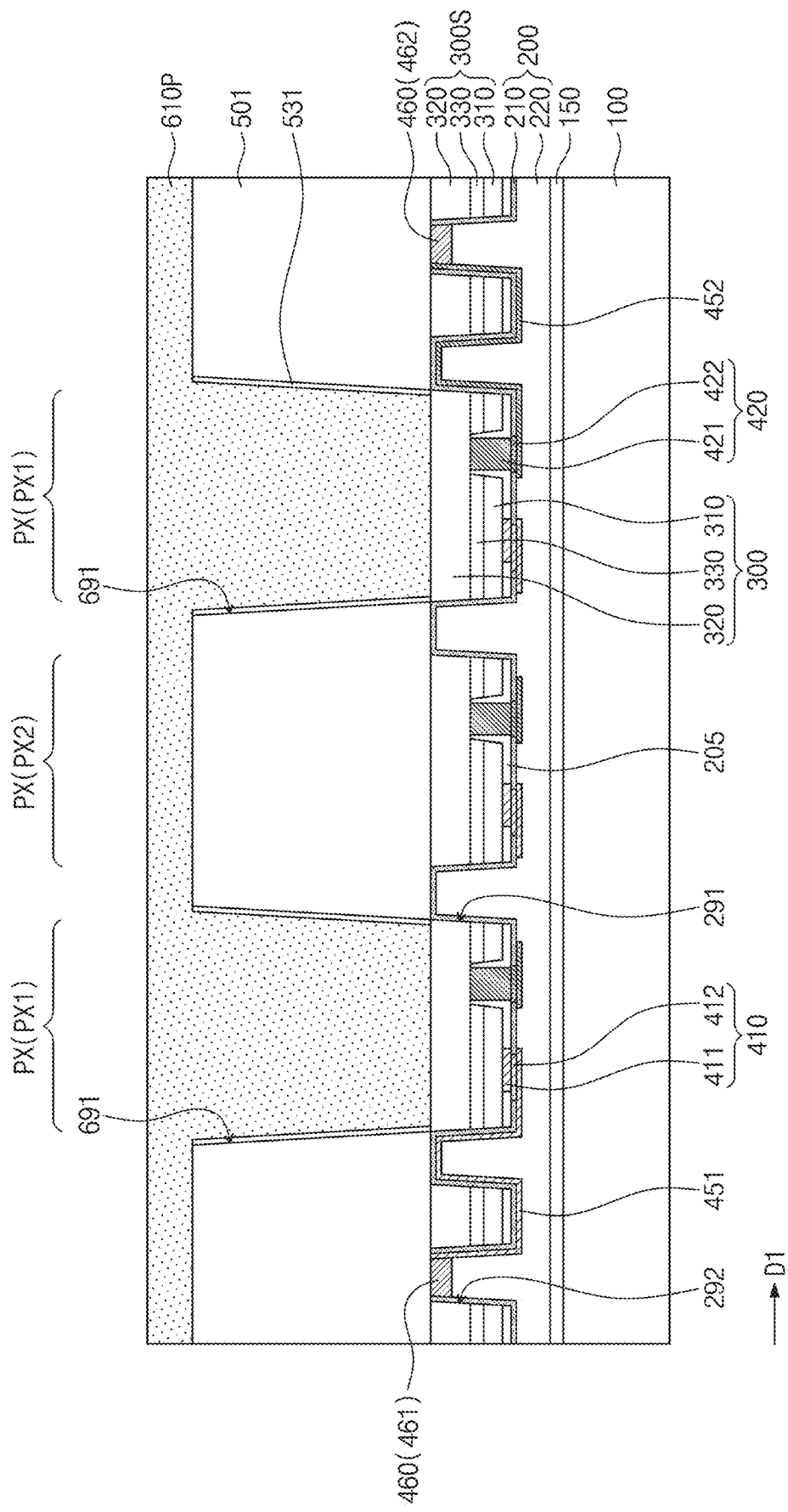

Referring to FIGS. 1A and 5B, a first fluorescent material may be provided in the first pixel openings 691 and on the support substrate 501, with the result that a first preliminary fluorescent layer 610P may be formed. The first preliminary fluorescent layer 610P may fill the first pixel openings 691 and cover the top surface of the support substrate 501.

Figure 5C:
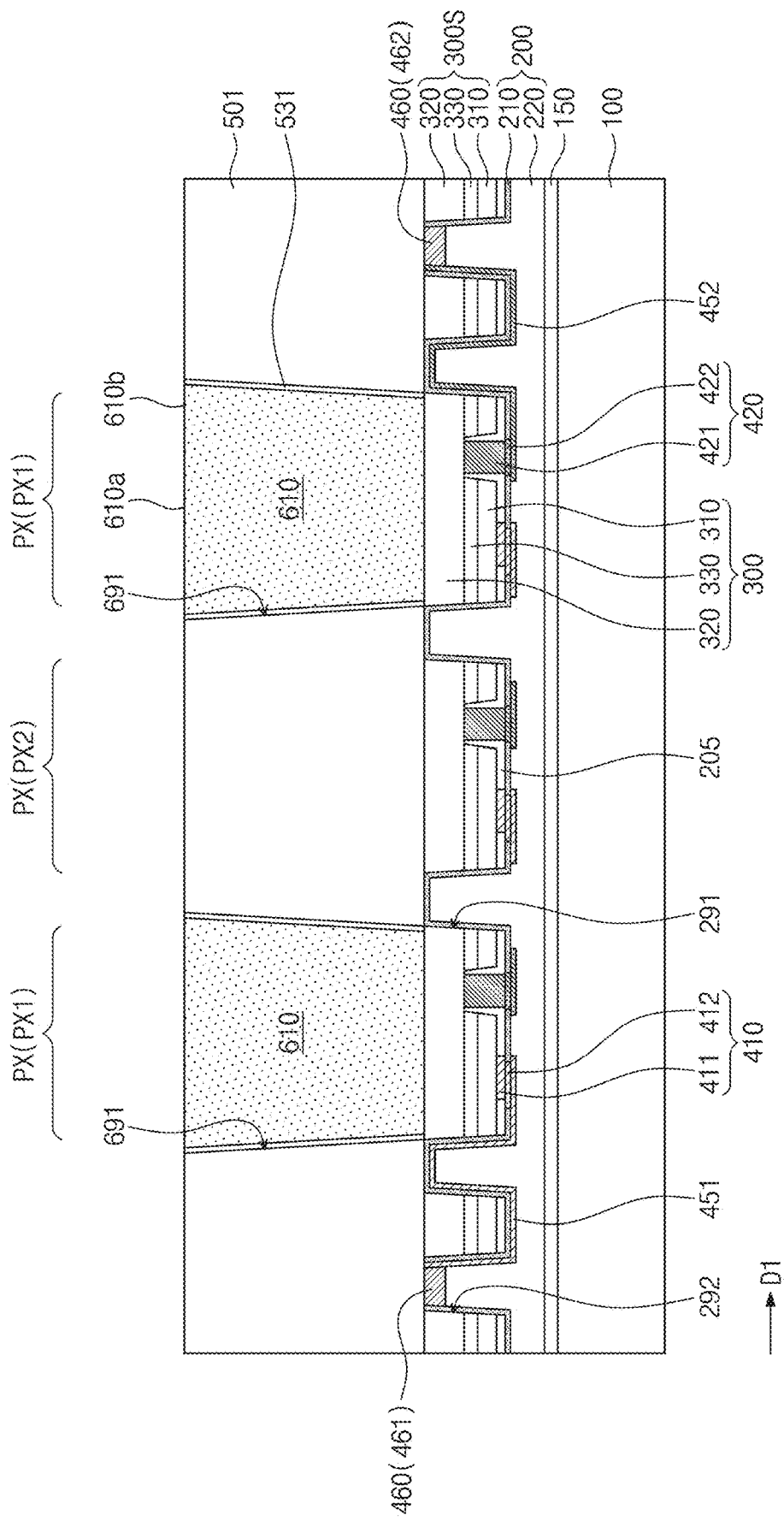

Referring to FIGS. 1A and 5C, an upper portion of the first preliminary fluorescent layer 610P may be removed to form a plurality of first fluorescent layers 610. A grinding process may be performed to remove the first preliminary fluorescent layer 610P. The grinding process may continue until the support substrate 501 is exposed. Therefore, the first fluorescent layers 610 may be separated from each other. Each of the first fluorescent layers 610 may be locally provided in a corresponding first pixel opening 691.

The grinding process may cause each of the first fluorescent layers 610 to have a top surface coplanar with that of the support substrate 501. The top surface of each of the first fluorescent layers 610 may be substantially flat. For example, a top surface 610a at the central portion of each of the first fluorescent layers 610 may be located at substantially the same level as that of a top surface 610b at the edge portion of each of the first fluorescent layers 610.

Figure 5D:
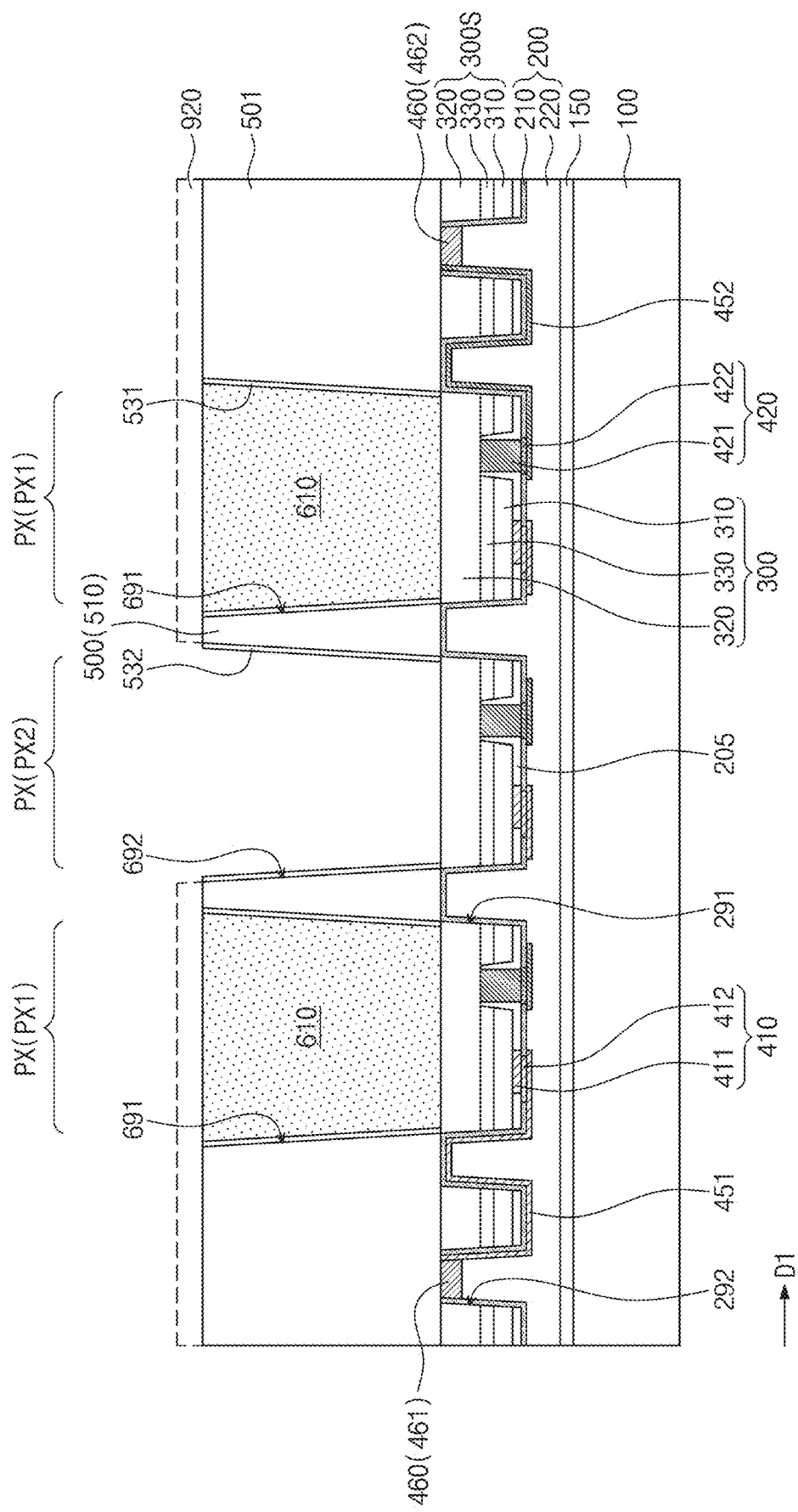

Referring to FIGS. 1A and 5D, a portion of the support substrate 501 may be removed to form the second pixel opening 692 and the first partition 510. A second mask layer 920 may be formed to cover the first fluorescent layer 610. The second pixel opening 692 may be formed by an etching process in which the second mask layer 920 is used as an etching mask to etch the support substrate 501. The first partition 510 may be a portion of the support substrate 501, which portion is provided between the pixel openings 691 and 692, and may define the pixel openings 691 and 692.

A second reflective layer 532 may be formed in the second pixel opening 692 and may cover the sidewall of the second pixel opening 692. The second reflective layer 532 may expose the top surface of the second semiconductor layer 320. The reflective layer 530 discussed in FIGS. 1A and 1B may include the first reflective layer 531 formed as illustrated in the example of FIG. 5A and the second reflective layer 532 formed as illustrated in the example of FIG. 5D. The second mask layer 920 may be removed.

Figure 5E:
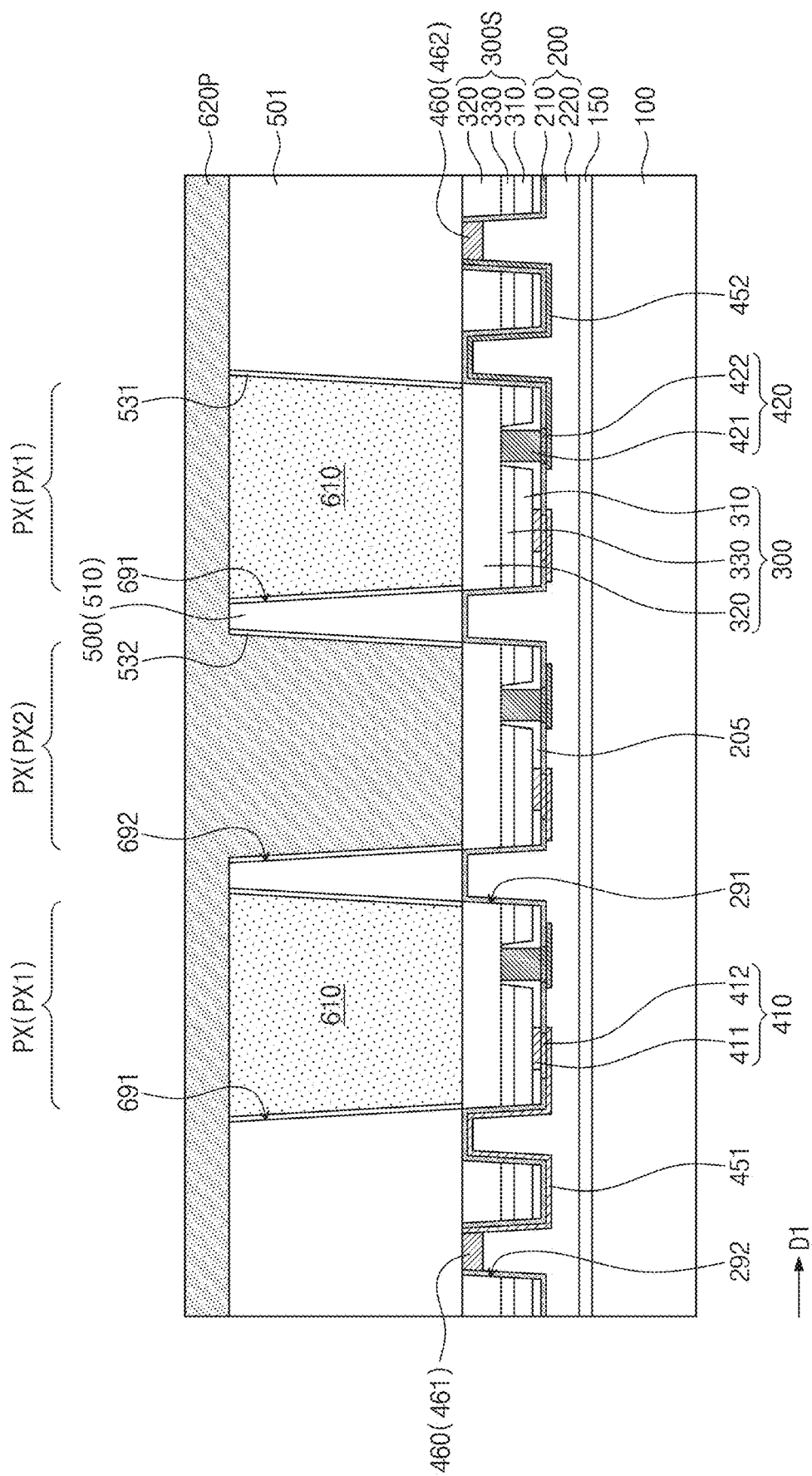

Referring to FIGS. 1A and 5E, a second fluorescent material may be provided in the second pixel opening 692 and on the support substrate 501, with the result that a second preliminary fluorescent layer 620P may be formed. The second preliminary fluorescent layer 620P may fill the second pixel opening 692 and cover the top surface of the support substrate 501. Although not shown, the second pixel opening 692 may be provided in plural spaced apart from each other. In some example embodiments, the second preliminary fluorescent layer 620P may fill the plurality of second pixel openings 692. The following will now describe an example in which a single second pixel opening 692 is provided.

Figure 5F:
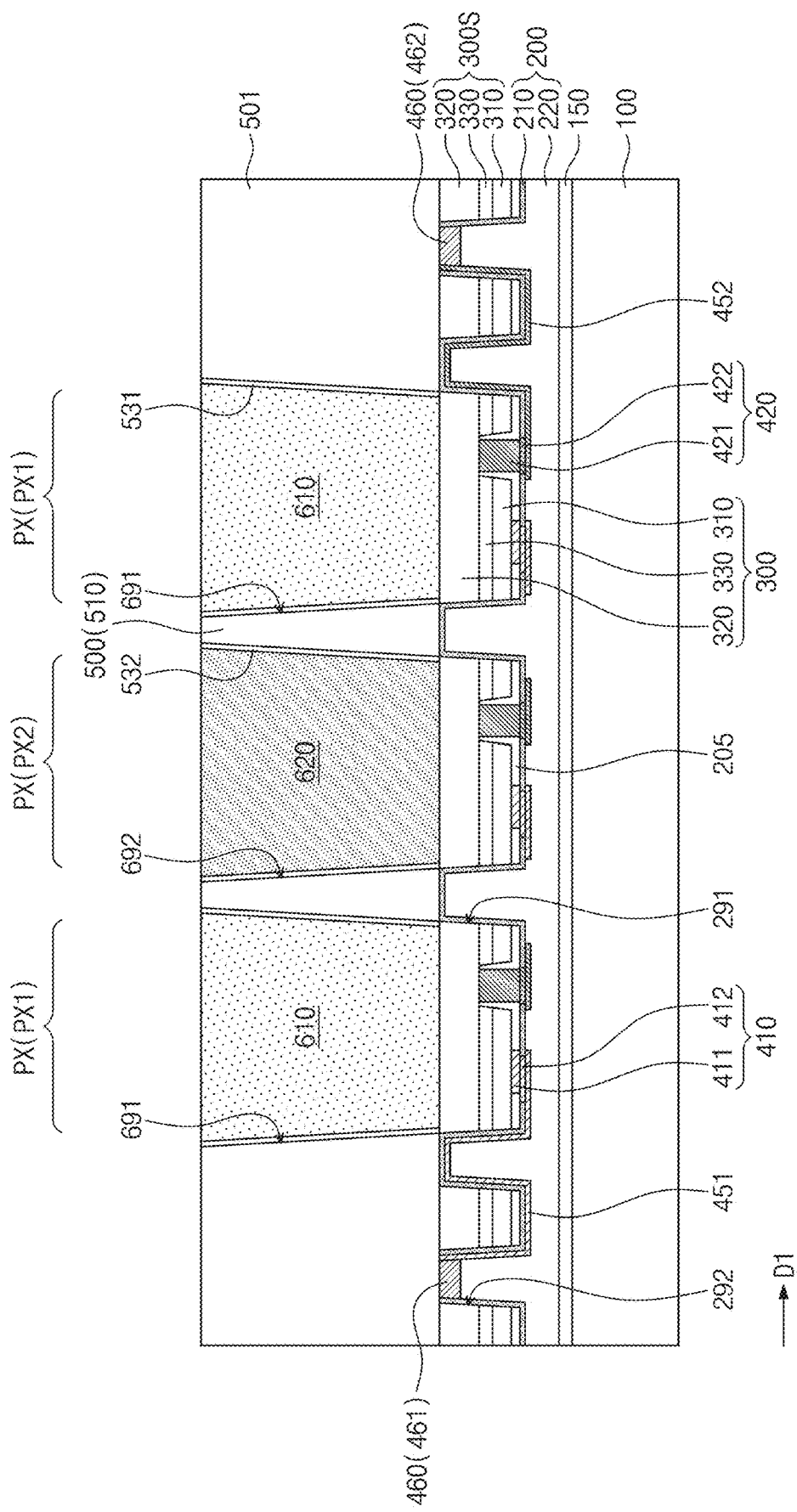

Referring to FIGS. 1A and 5F, an upper portion of the second preliminary fluorescent layer 620P may be removed to form the second fluorescent layer 620. A grinding process may be performed to remove the second preliminary fluorescent layer 620P. The grinding process may continue until the support substrate 501 is exposed. Although not shown, the second fluorescent layer 620 may be formed in plural, and each of the plurality of second fluorescent layers 620 may be provided locally in a corresponding second pixel opening 692. The grinding process may cause the second fluorescent layer 620 to have a flat top surface. The top surface of the second fluorescent layer 620 may be coplanar with that of the support substrate 501.

Referring back to FIGS. 1A and 1B, the support substrate 501 may be etched to form the second partition 520. The second partition 520 may expose the first connection pad 461 and the second connection pad 462. Through the processes mentioned above, the light emitting device 2000 discussed in FIGS. 1A and 1B may eventually be fabricated.

Figure 6B:
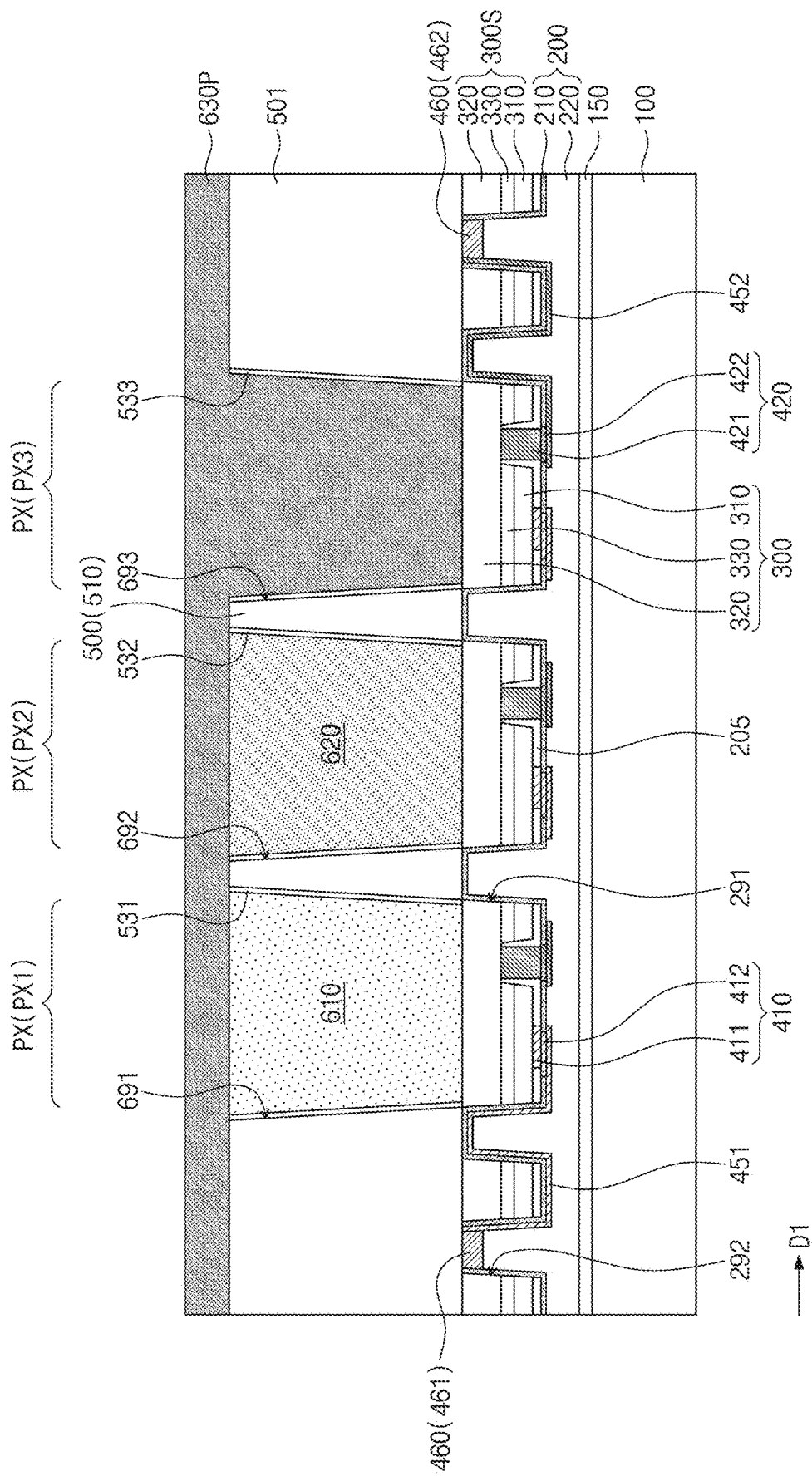
Figure 6C:
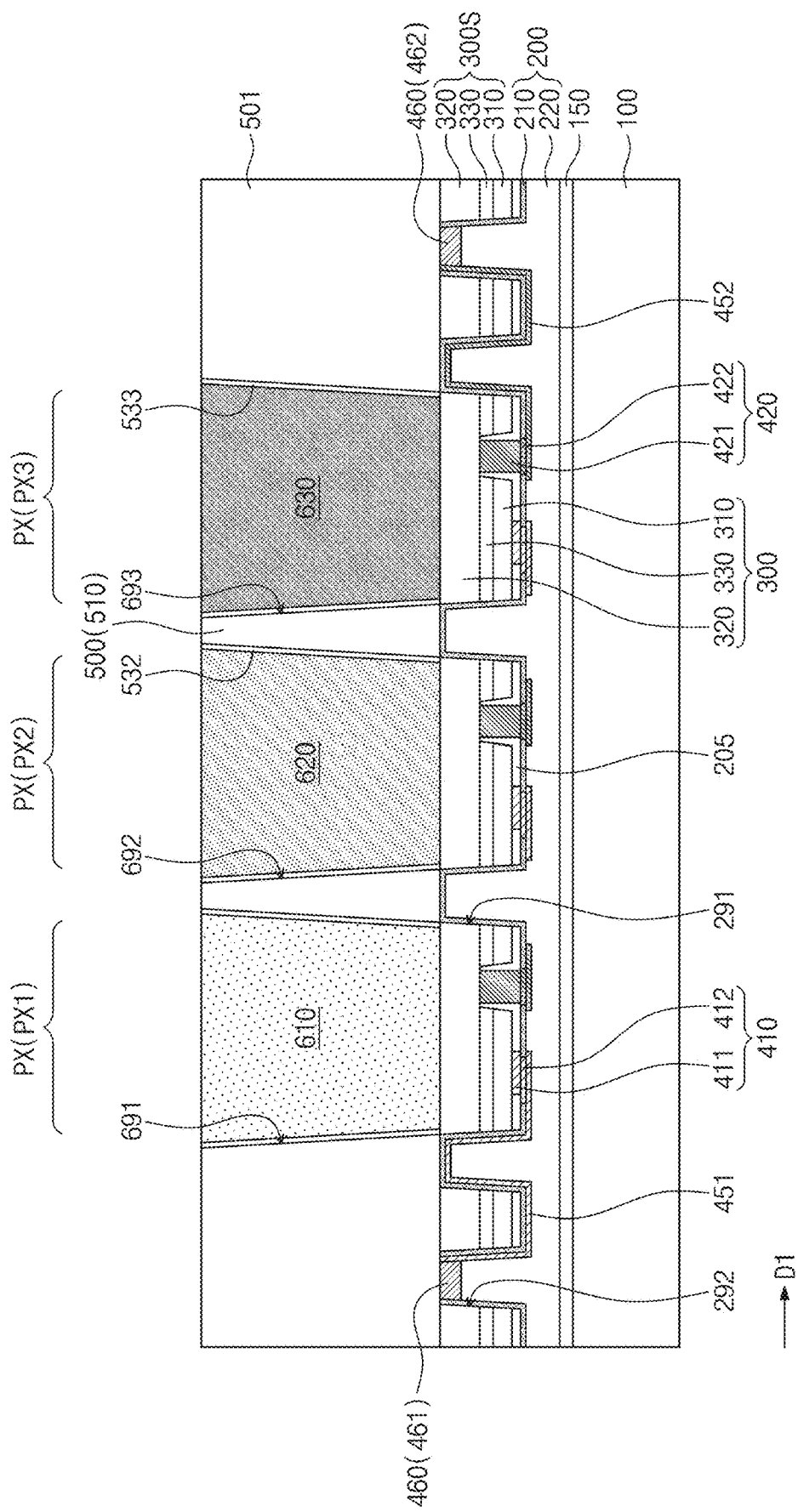

FIGS. 6A to 6C illustrate cross-sectional views showing a method of fabricating a light emitting device according to some example embodiments. FIG. 2A will also be referred in describing FIGS. 6A to 6C.

Referring to FIGS. 2A and 6A, the first fluorescent layer 610 may be formed on the first pixel PX1, and the second fluorescent layer 620 may be formed on the second pixel PX2. The formation of the first and second fluorescent layers 610 and 620 may be substantially the same as that discussed above in FIGS. 5A and 5F. Before the formation of the first and second fluorescent layers 610 and 620, the LED chip 300, the dielectric layer 205, the electrode patterns 410 and 420, the line patterns 451 and 452, the connection pads 460, and the pixel isolation pattern 200 may be formed on the support substrate 501, and the substrate 100 may be adhered to the pixel isolation pattern 200.

A third mask layer 930 may be formed on the support substrate 501 and the first and second fluorescent layers 610 and 620, and may expose the top surface of the support substrate 501. An etching process may be performed in which the third mask layer 930 is used as an etching mask to etch the support substrate 501 to form the third pixel opening 693 and the first partition 510. The third pixel opening 693 may be provided on the third pixel PX3. The third pixel opening 693 may be spaced apart from the first and second pixel openings 691 and 692, and may expose the second semiconductor layer 320. A third reflective layer 533 may be formed in the third pixel opening 693 and may cover a sidewall of the third pixel opening 693. The third reflective layer 533 may expose the top surface of the second semiconductor layer 320. The reflective layer 530 discussed in FIGS. 2A and 2B may include the first reflective layer 531, the second reflective layer 532, and the third reflective layer 533. Although not shown, the third pixel opening 693 may be formed in plural. The third mask layer 930 may be removed.

Referring to FIGS. 2A and 6B, a third fluorescent material may be provided in the third pixel openings 693 and on the support substrate 501, with the result that a third preliminary fluorescent layer 630P may be formed. The third preliminary fluorescent layer 630P may fill the third pixel openings 693 and cover the top surface of the support substrate 501.

Referring to FIGS. 2A and 6C, an upper portion of the third preliminary fluorescent layer 630P may be removed to form the third fluorescent layer 630. A grinding process may be performed to remove the third preliminary fluorescent layer 630P. The grinding process may continue until the top surface of the support substrate 501 is exposed. Although not shown, the third fluorescent layer 630 may be formed in plural, and each of the plurality of third fluorescent layers 630 may be provided locally in a corresponding third pixel opening 693. The grinding process may cause the third fluorescent layer 630 to have a top surface coplanar with that of the support substrate 501. The third fluorescent layer 630 may have a flat top surface.

Referring back to FIG. 2B, the support substrate 501 may be etched to form the second partition 520. Through the processes mentioned above, the light emitting device 2000A discussed in FIGS. 2A and 2B may eventually be fabricated.

The following will now describe a light emitting module and a method of fabricating the same according to some example embodiments.

Referring back to FIGS. 1A, 1B, 2A, and 2B, the light emitting device 2000 may be disposed on the module substrate 1000. The light emitting device 2000 may be fabricated as illustrated in the example of FIGS. 5A to 5F. The bonding wires 800 may be formed on corresponding connection pads 460. The bonding wires 800 may be correspondingly coupled to the connection pads 460 and the substrate pads 1100. Therefore, the light emitting device 2000 may be electrically connected to the module substrate 1000. On the module substrate 1000, the light guide structure 3000 may be disposed spaced apart from the light emitting device 2000. As a result, the light emitting module 1 may eventually be fabricated as shown in FIGS. 1A and 1B. For another example, the light emitting module 1 may be fabricated using the light emitting device 2001 formed as illustrated in the example of FIGS. 3A to 3I.

As shown in FIGS. 2A and 2B, the light emitting module 1A may be fabricated using the light emitting device 2000A formed as illustrated in the example of FIGS. 6A to 6C. For another example, the light emitting module 1A may be fabricated using the light emitting device 2001A formed as illustrated in the example of FIGS. 4A and 4B.

Figure 7:
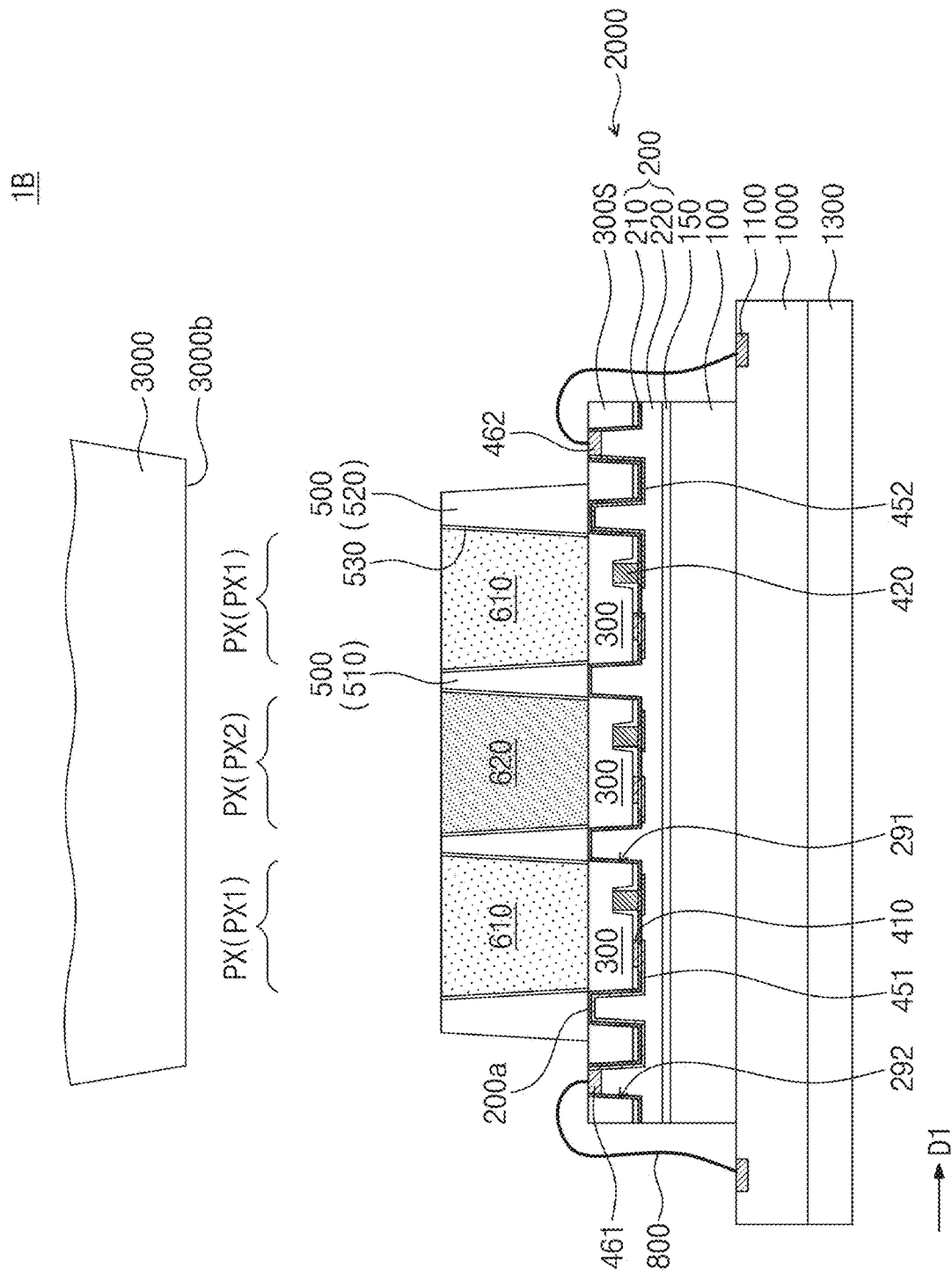
FIG. 7 illustrates a cross-sectional view showing a light emitting module according to some example embodiments.

FIG. 7 illustrates a cross-sectional view taken along line A-B of FIG. 1A, showing a light emitting module according to some example embodiments.

Referring to FIG. 7, a light emitting module 1B may include a module substrate 1000, a light emitting device 2000, a light guide structure 3000, and/or a heat radiation structure 1300. The heat radiation structure 1300 may be provided on a bottom surface of the module substrate 1000. The heat radiation structure 1300 may have high thermal conductance. The heat radiation structure 1300 may include a metallic material such as aluminum or copper, but the present inventive concepts are not limited thereto. When the light emitting module 1B operates, heat generated from the light emitting device 2000 may be promptly discharged outwardly through the module substrate 1000 and the heat radiation structure 1300. Accordingly, the light emitting module 1B may improve in thermal characteristics and operating reliability.

An arrangement of the heat radiation structure 1300 may be variously changed. For example, the heat radiation structure 1300 may be disposed on a lateral surface of the module substrate 1000. For another example, the heat radiation structure 1300 may cover the lateral and bottom surfaces of the module substrate 1000.

Figure 8A:
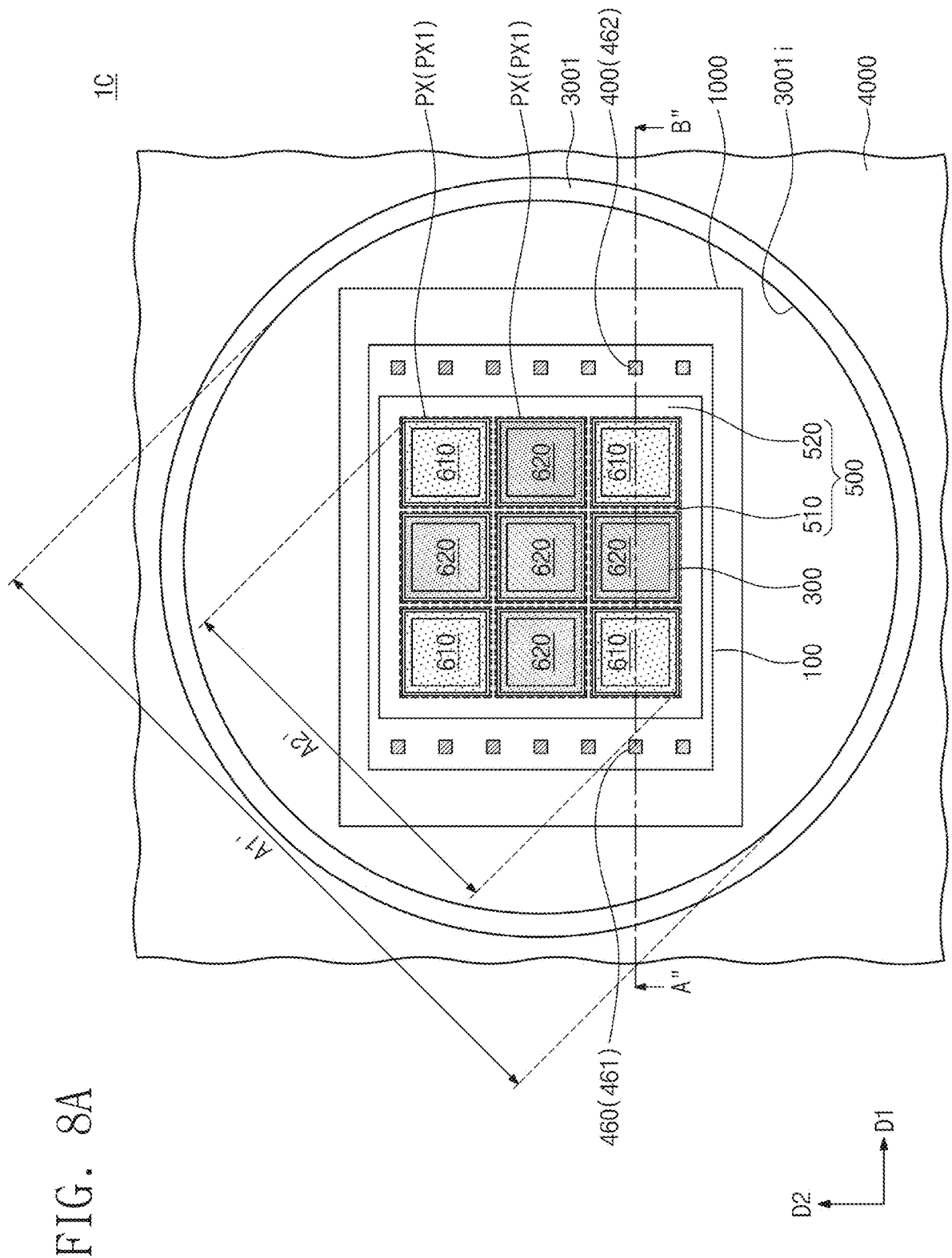
FIG. 8A illustrates a plan view showing a light emitting module according to some example embodiments.
Figure 8B:
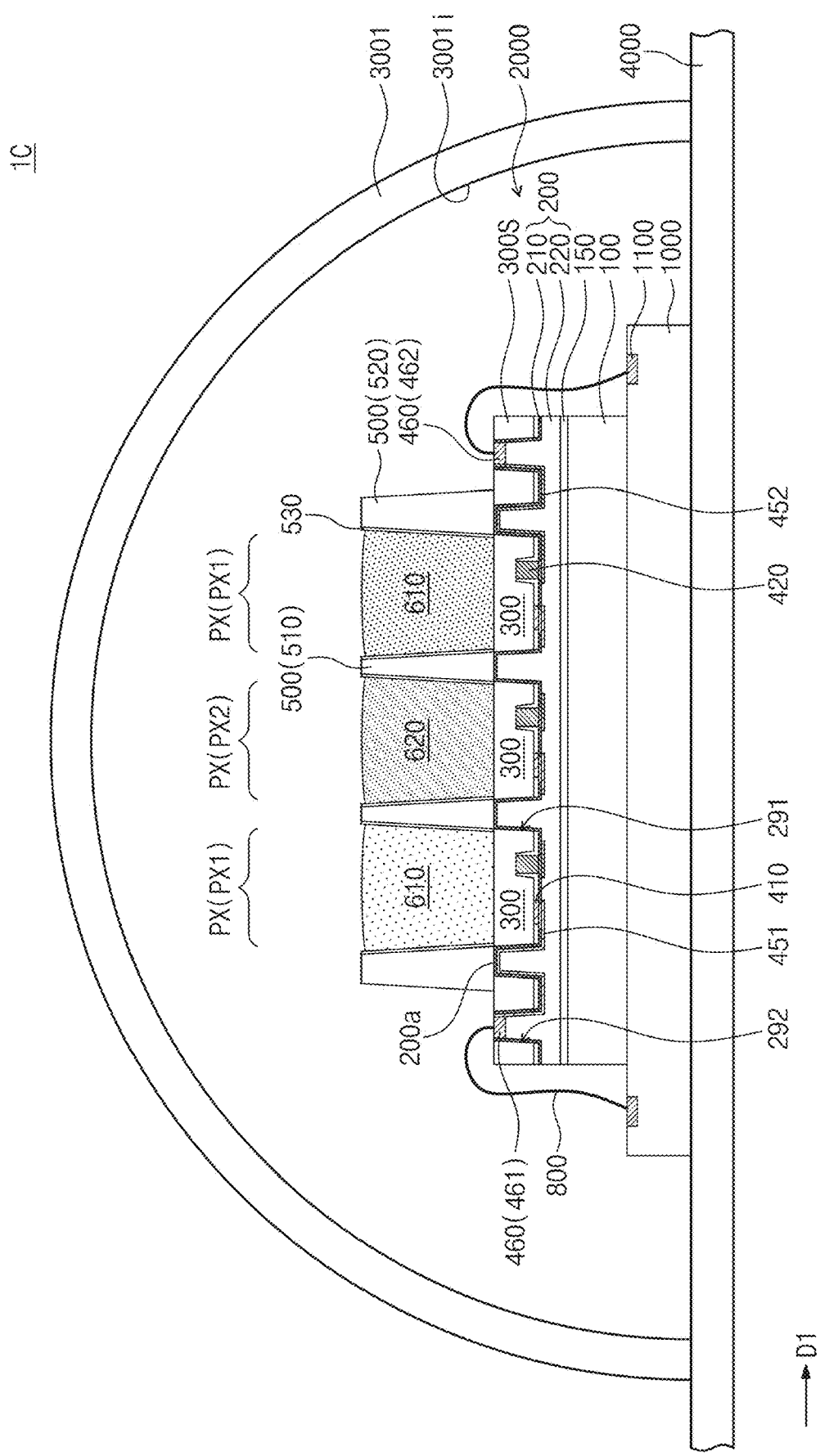
FIG. 8B illustrates a cross-sectional view taken along line A"-B" of FIG. 8A.

FIG. 8A illustrates a plan view showing a light emitting module according to some example embodiments. FIG. 8B illustrates a cross-sectional view taken along line A"-B" of FIG. 8A.

Referring to FIGS. 8A and 8B, a light emitting module 1C may include a cover 4000, a module substrate 1000, a light emitting device 2000, and/or a light guide structure 3001. For example, the cover 4000 may be a housing or a printed circuit board. The module substrate 1000 on which the light emitting device 2000 is mounted may be disposed on the cover 4000 to cause a bottom surface of the module substrate 1000 to face the cover 4000. The module substrate 1000 and the light emitting device 2000 may be substantially the same as those discussed above in FIGS. 1A and 1B. For another example, the light emitting device 2000A discussed in FIGS. 2A and 2B may be mounted on the module substrate 1000.

The light guide structure 3001 may be provided on the cover 4000. The light guide structure 3001 may be spaced apart from the light emitting device 2000, and may cover the light emitting device 2000. The light guide structure 3001 may define a space in which the light emitting device 2000 is provided. An air layer or a resin layer (not shown) may be provided between the light guide structure 3001 and the light emitting device 2000. The light guide structure 3001 may have a hemispherical shape. For example, the light guide structure 3001 may have a hemispherical outer surface and a hemispherical inner surface 3001i. The light guide structure 3001 may have an inside diameter A1' the same as or greater than a maximum diameter A2' of a pixel array. The inside diameter A1' of the light guide structure 3001 may mean a maximum diameter at the hemispherical inner surface 3001i of the light guide structure 3001. The light guide structure 3001 may include the same material as that of the light guide structure 3000 discussed above in FIGS. 1A to 1D. The light guide structure 3001 may be reversibly attached or detached to the cover 4000.

Light emitted from the light emitting device 2000 may be outwardly discharged through the light guide structure 3001. The light guide structure 3001 may improve luminance efficiency of the light emitting module 1C. The light guide structure 3001 may control illuminance of light emitted from the light emitting device 2000.

For another example, the heat radiation structure 1300 discussed in FIG. 7 may further be provided on a bottom or lateral surface of the module substrate 1000. In some example embodiments, the heat radiation structure 1300 may be disposed on a top surface of the cover 4000.

Figure 9:
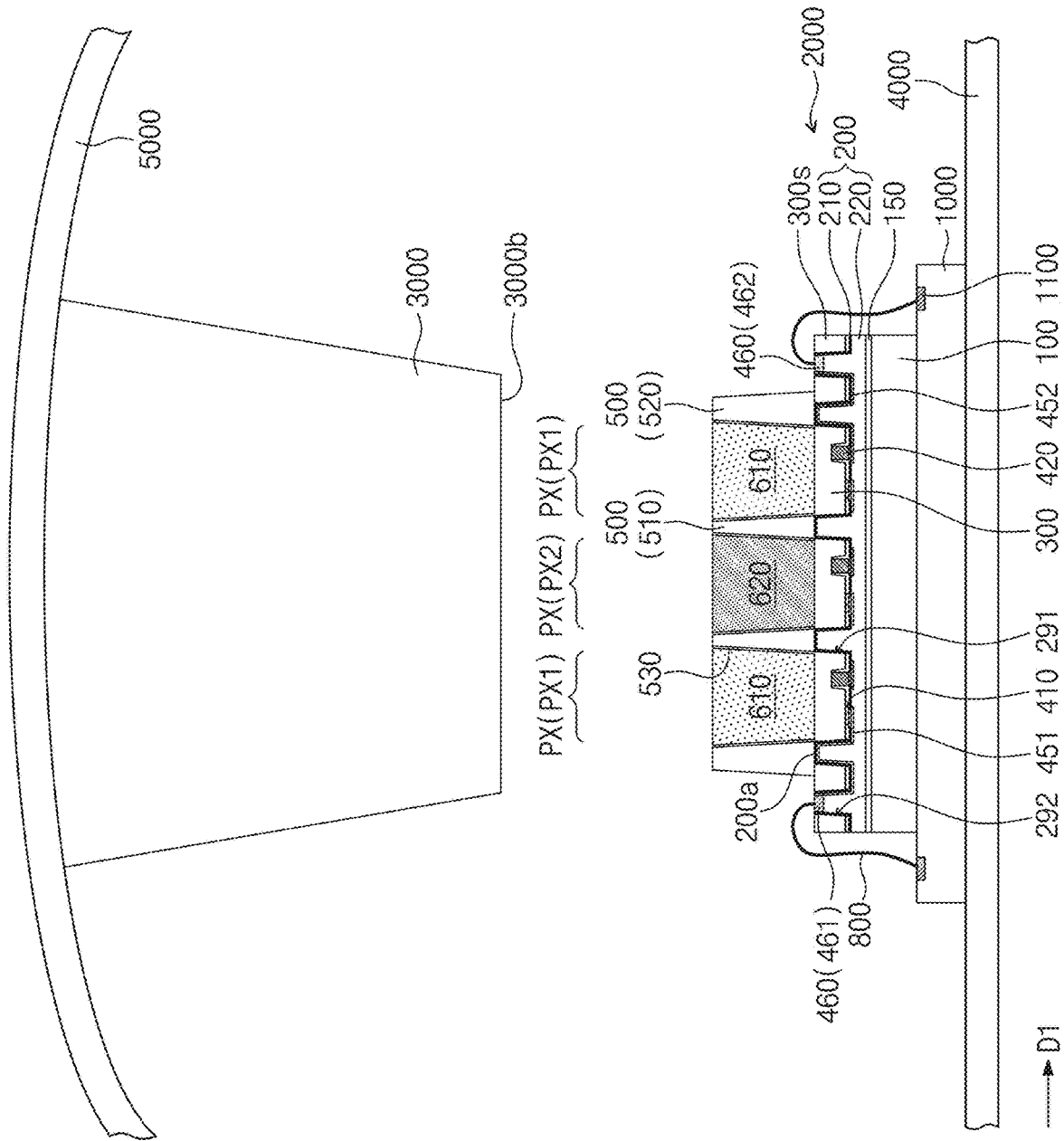
FIG. 9 illustrates a cross-sectional view showing a light emitting module according to some example embodiments.

FIG. 9 illustrates a cross-sectional view showing a light emitting module according to some example embodiments.

Referring to FIG. 9, a light emitting module 1D may include a cover 4000, a module substrate 1000, a light emitting device 2000, a light guide structure 3000, and/or an external structure 5000. The external structure 5000 may be a housing. An upper portion of the light guide structure 3000 may be engaged and rigidly coupled with the external structure 5000. The cover 4000 may be substantially the same as that discussed in FIG. 8. The module substrate 1000, the light guide structure 3000, and the light emitting device 2000 may be substantially the same as those discussed above in FIGS. 1A and 1B.

In the explanation of FIGS. 7, 8A, 8B, and 9, the light emitting device 2000 may be fabricated as illustrated in the example of FIGS. 5A to 5F. For another example, the light emitting module 1B, 1C, or 1D may be fabricated using the light emitting device 2001 fabricated as discussed in the example of FIGS. 3A to 3I, the light emitting device 2001A fabricated as discussed in the example of FIGS. 4A and 4B, or the light emitting device 2000A fabricated as discussed in the example of FIGS. 6A to 6C.

Figure 10:
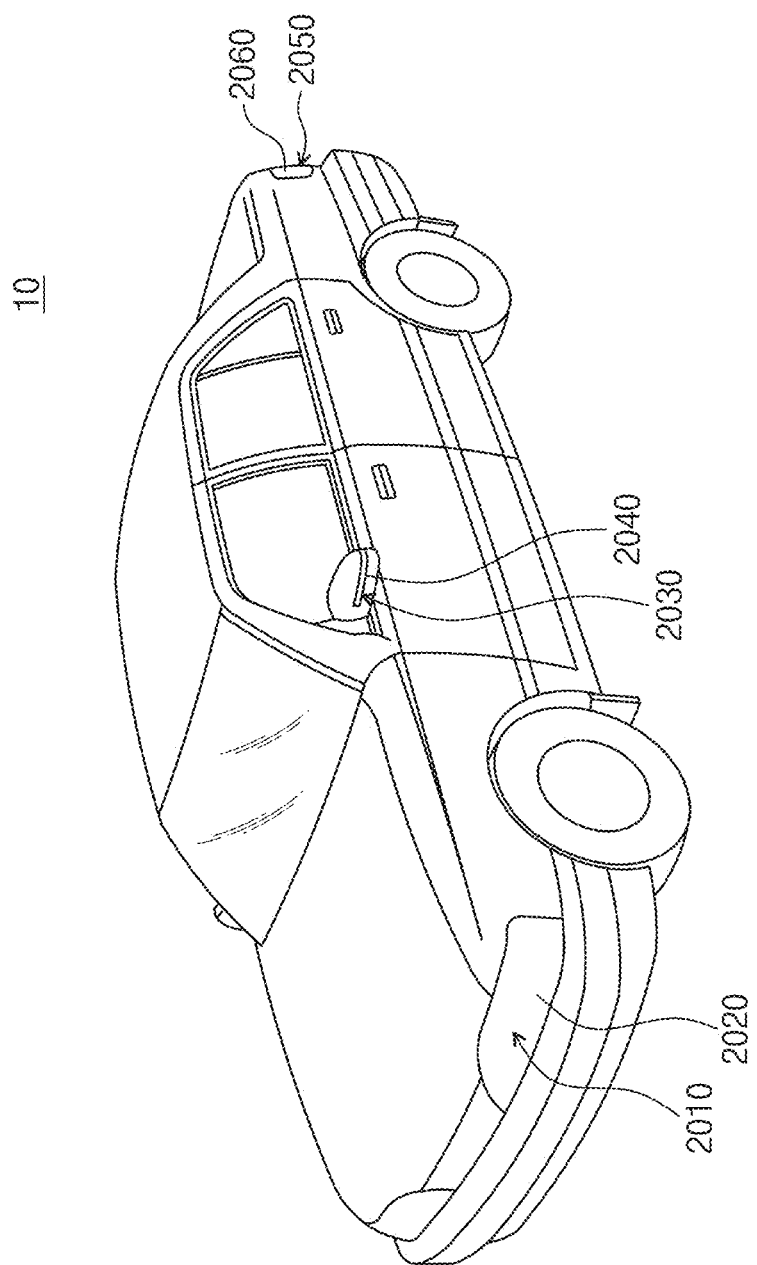
FIG. 10 illustrates a perspective view showing an automotive illumination device according to some example embodiments.

FIG. 10 illustrates a perspective view showing an automotive illumination device according to some example embodiments.

Referring to FIG. 10, a car 10 may include one or more of a head-lamp module 2020, a mirror-lamp module 2040, a tail-lamp module 2060, and an inner-lamp module. The head-lamp module 2020 may be installed in a head-lamp part 2010. The mirror-lamp module 2040 may be installed in an external side-mirror part 2030. The tail-lamp module 2060 may be installed in a tail-lamp part 2050. The inner-lamp module may be provided inside the car 10. One or more of the head-lamp module 2020, the mirror-lamp module 2040, the tail-lamp module 2060, and the inner-lamp module may be achieved by one of the light emitting modules 1, 1A, 1B, 1C, and 1D discussed above. For example, the light emitting modules 1, 1A, 1B, 1C, and 1D may be used as an automobile illumination device.

According to the present inventive concepts, a light emitting device may produce at least two colors. A single light emitting chip may be used as a light emitting device, and thus a light emitting module may have small size and weight. The reduction in size of the light emitting module may increase the degree of design freedom of a light emitting apparatus including the light emitting module. The light emitting module may decrease in power consumption. A light guide structure may be provided to improve luminance efficiency.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:

1. A light emitting module, comprising:
    a module substrate;
    a light emitting device on the module substrate; and
    a light guide structure apart from the module substrate and surrounding the light emitting device in plan view,
    wherein the light emitting device comprises
        a first pixel and a second pixel each including a light emitting diode (LED) chip configured to emit light whose wavelength falls within a range of blue color or ultraviolet ray; and
        a wavelength conversion material on a top surface of at least one of the first and second pixels, and
    wherein an interval between the light emitting device and the light guide structure is in a range from about 0.1 mm to about 5 mm.

2. The light emitting module of claim 1, wherein the light guide structure and the light emitting device have an air layer therebetween.

3. The light emitting module of claim 1, wherein the light emitting device further comprises a pixel isolation pattern between and defining the first pixel and the second pixel,
    wherein the LED chip of the first pixel emits light whose wavelength is the same as a wavelength of light emitted from the LED chip of the second pixel.

4. The light emitting module of claim 3, further comprising:
    a plurality of fluorescent layers correspondingly provided on the first and second pixels and each including the wavelength conversion material; and
    a plurality of partition wall structures on the pixel isolation pattern and surrounding the fluorescent layers in the plan view,
    wherein the partition wall structures include a silicon substrate.

5. The light emitting module of claim 1, wherein the light emitting device has a pixel array region,
    wherein the pixel array region includes the first pixel, the second pixel, and a first partition between the first and second pixels,
    a diameter of the light guide structure being the same as or greater than a diameter of the pixel array region.

6. The light emitting module of claim 1, wherein the light guide structure and the light emitting device have a resin layer therebetween.

7. The light emitting module of claim 1, wherein the wavelength conversion material includes a quantum dot fluorescent material having a nano-sized particle.

8. The light emitting module of claim 1, wherein the light guide structure has an elongated cylindrical waveguide.

9. A light emitting module, comprising:
    a module substrate;
    a light emitting device on the module substrate; and
    a light guide structure apart from the module substrate and guiding light emitted from the light emitting device,
    wherein the light emitting device comprises
        a first pixel and a second pixel each including a light emitting diode (LED) chip that emits light whose wavelength falls within a range of blue color or ultraviolet ray; and
        a wavelength conversion material on a top surface of at least one of the first and second pixels, and
    wherein an interval between the light emitting device and the light guide structure is in a range from about 0.1 mm to about 5 mm.

10. The light emitting module of claim 9, wherein the light guide structure and the light emitting device have an air layer therebetween.

11. The light emitting module of claim 9, wherein the light emitting device further comprises a pixel isolation pattern between and defining the first pixel and the second pixel,
    wherein a peak wavelength of light emitted from each LED chip of the first and second pixels has a range equal to or less than about 5% of an average peak wavelength of the light emitted from the LED chip of the first and second pixels.

12. The light emitting module of claim 11, further comprising:
    a fluorescent layer on the LED chip and including the wavelength conversion material; and
    a partition surrounding the fluorescent layer, when viewed in plan,
    wherein the partition includes a silicon substrate.

13. The light emitting module of claim 9, further comprising a plurality of bonding wires on an edge region of the light emitting device and coupled to the light emitting device and the module substrate.

14. An automobile illumination device, comprising:
    a module substrate;
    a light emitting device on the module substrate; and
    a light guide structure apart from the module substrate and guiding light emitted from the light emitting device,
    wherein the light emitting device comprises
        a first pixel and a second pixel each including a light emitting diode (LED) chip configured to emit light whose wavelength falls within a range of blue color or ultraviolet ray; and
        a wavelength conversion material on a top surface of at least one of the first and second pixels, and
    wherein an interval between the light emitting device and the light guide structure is in a range from about 0.1 mm to about 5 mm.

15. The automobile illumination device of claim 14, wherein the light guide structure and the light emitting device have an air layer therebetween.

16. The automobile illumination device of claim 14, wherein the light emitting device further comprises a pixel isolation pattern between and defining the first pixel and the second pixel,
    wherein a peak wavelength of light emitted from each LED chip of the first and second pixels has a range equal to or less than about 5% of an average peak wavelength of the light emitted from the LED chip of the first and second pixels.

17. The automobile illumination device of claim 14, further comprising:
a fluorescent layer on the LED chip and including the wavelength conversion material; and
a partition surrounding the fluorescent layer, when viewed in plan,
wherein the partition includes a silicon substrate.

* * * * *